US009368324B2

(12) United States Patent  (10) Patent No.: US 9,368,324 B2
Li et al.  (45) Date of Patent: Jun. 14, 2016

(54) MEASUREMENT AND INSPECTION DEVICE

(71) Applicant: HITACHI HIGH-TECHNOLOGIES CORPORATION, Minato-ku, Tokyo (JP)

(72) Inventors: Wen Li, Tokyo (JP); Hiroyuki Takahashi, Tokyo (JP); Makoto Suzuki, Tokyo (JP); Hajime Kawano, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/759,222

(22) PCT Filed: Nov. 22, 2013

(86) PCT No.: PCT/JP2013/081535
§ 371 (c)(1),
(2) Date: Jul. 3, 2015

(87) PCT Pub. No.: WO2014/112205
PCT Pub. Date: Jul. 24, 2014

(65) Prior Publication Data
US 2015/0371819 A1  Dec. 24, 2015

(30) Foreign Application Priority Data

Jan. 18, 2013 (JP) ................................. 2013-007706

(51) Int. Cl.
*H01J 37/28* (2006.01)
*H01J 37/22* (2006.01)
(Continued)

(52) U.S. Cl.
CPC ............... *H01J 37/28* (2013.01); *H01J 37/244* (2013.01); *H01J 37/265* (2013.01);
(Continued)

(58) Field of Classification Search
CPC ....... H01J 37/28; H01J 37/244; H01J 37/222; G01N 23/225; G01N 23/04

USPC ........... 250/307, 310, 311, 492.3, 306, 492.2, 250/491.1; 382/145
See application file for complete search history.

(56) References Cited

U.S. PATENT DOCUMENTS 6,169,281 B1 * 1/2001 Chen ..................... B82Y 35/00
                                                        250/216
6,903,821 B2 * 6/2005 Nara ................... G03F 7/70616
                                                         356/394

(Continued)

FOREIGN PATENT DOCUMENTS

JP        7-326314 A    12/1995
JP     2000-338068 A   12/2000
(Continued)

*Primary Examiner* — David A Vanore
(74) *Attorney, Agent, or Firm* — Miles & Stockbridge P.C.

(57) ABSTRACT

The present invention relates to a measurement and inspection device of a scanning-type electron beam system, and provides a technique for achieving a measuring/inspecting process with high precision in accordance with a scanning speed. A secondary electron signal detection system in the present measurement and inspection device is suitably applicable to a scanning control with a plurality of scanning speeds, and the device is provided with a detector 107 for detecting a secondary electron signal (SE) derived from an irradiation onto a sample 110 with an electron beam by a scanning control process, a preamplifier 30 for current-to-voltage converting and pre-amplifying the output, an analog signal processing and amplifying unit 51 to which the output of the preamplifier 30 is inputted to carry out an analog processing and amplifying process thereon as a secondary electron signal detection unit 50, an ADC 52 for analog-to-digital converting the output thereof, and an image processing unit 205 for generating an image for use in measurements or inspections based upon the output. A control unit 210 carries out a switching control of respective units including an LPF (12) inside the analog signal processing and amplifying unit 51, in accordance with a scanning speed or the like.

15 Claims, 13 Drawing Sheets

(51) Int. Cl.
*H01J 37/244* (2006.01)
*H01J 37/26* (2006.01)

(52) U.S. Cl.
CPC ... *H01J 2237/221* (2013.01); *H01J 2237/2448* (2013.01); *H01J 2237/2485* (2013.01); *H01J 2237/2809* (2013.01)

(56) References Cited

U.S. PATENT DOCUMENTS

| | | | | |
|---|---|---|---|---|
| 7,408,155 B2 * | 8/2008 | Oosaki | ............... | G01N 23/225 250/307 |
| 7,796,801 B2 * | 9/2010 | Kitamura | ............... | G06K 9/00 348/125 |
| 7,884,322 B2 * | 2/2011 | Sasajima | ............... | G06T 7/001 250/306 |
| 8,003,940 B2 * | 8/2011 | Oosaki | ............... | H01J 37/28 250/306 |
| 8,086,022 B2 * | 12/2011 | Miyai | ............... | G01N 23/225 250/311 |
| 8,862,638 B2 * | 10/2014 | Williamson | ............ | G06F 17/17 706/47 |
| 8,890,096 B2 * | 11/2014 | Li | ............... | H01J 37/265 250/307 |
| 9,177,759 B2 * | 11/2015 | Li | ............... | H01J 37/28 |
| 2002/0024021 A1 * | 2/2002 | Iwabuchi | ............... | G01N 23/04 250/492.3 |
| 2002/0030166 A1 * | 3/2002 | Hiroi | ............... | H01J 37/244 250/492.3 |
| 2012/0307038 A1 * | 12/2012 | Hoshino | ............... | H01J 37/244 348/80 |

FOREIGN PATENT DOCUMENTS

| | | |
|---|---|---|
| JP | 2003-257352 A | 9/2003 |
| JP | 2006-093251 A | 4/2006 |
| JP | 2006-162609 A | 6/2006 |
| JP | 2009-032445 A | 2/2009 |
| JP | 2011-165450 A | 8/2011 |

* cited by examiner

FIG. 8
(a)
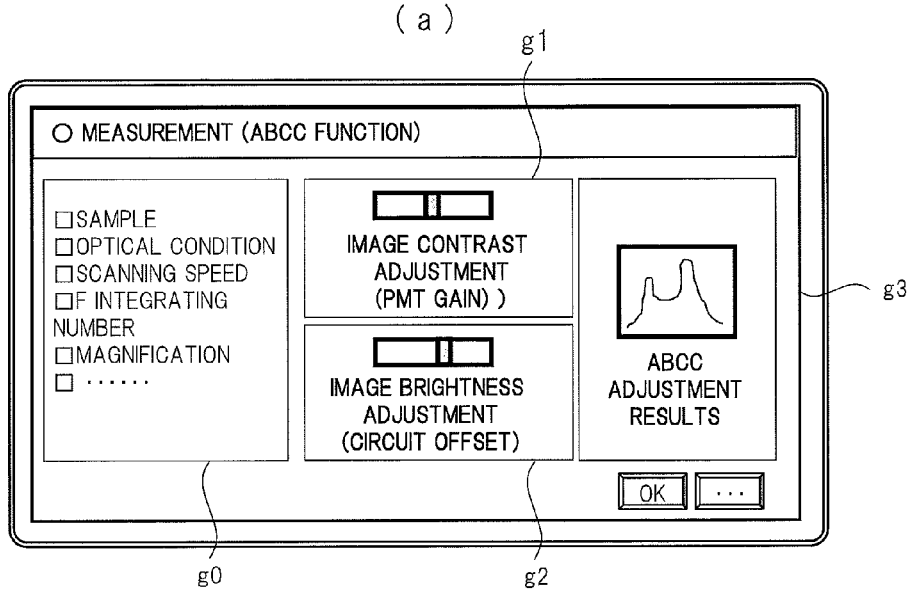
(b)
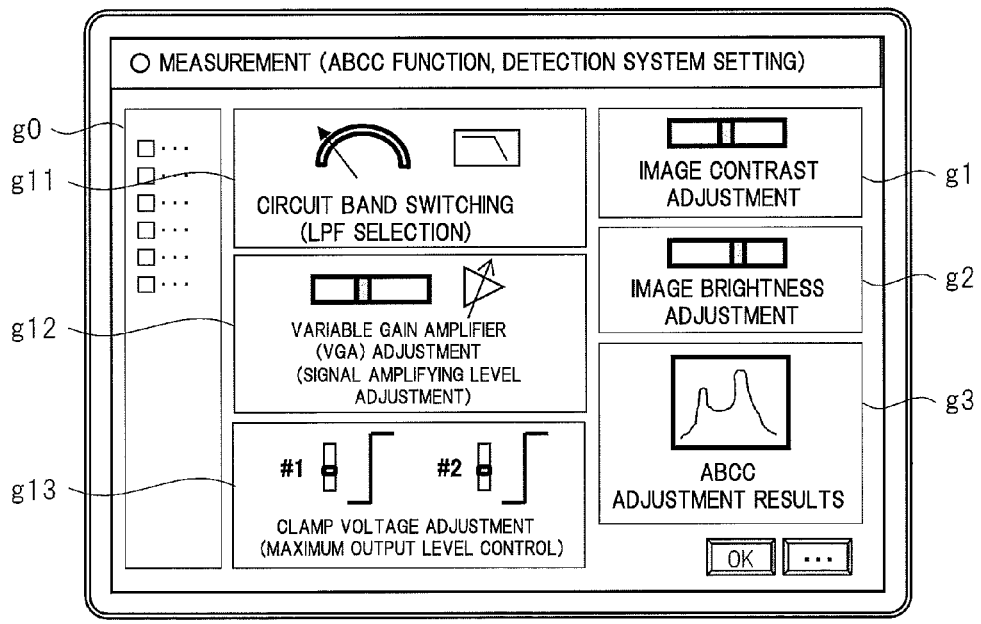

MEASUREMENT AND INSPECTION DEVICE

TECHNICAL FIELD

The present invention relates to a measurement and inspection device that carries out a measuring process or an inspecting process on a sample or an object, such as a semiconductor substrate, a wafer or the like, and to a measuring and inspecting method for carrying out a measuring and inspecting process by using such a device. Moreover, the present invention also relates to a scanning electron microscope (SEM) of a scanning-type electron beam system, or the like.

BACKGROUND ART

In a semiconductor manufacturing process, high miniaturization of a circuit pattern to be formed on a wafer has been developed, and a process monitoring operation for monitoring whether or not a pattern is formed in the same manner as designed has become more and more important. For example, in order to detect occurrence of a failure or defect in the semiconductor manufacturing process in an early stage or beforehand, measuring and inspecting processes are carried out on a wafer circuit pattern or the like, upon completion of each of the manufacturing processes.

At the time of the above-mentioned measurements or inspections, in a measuring/inspecting method in a measurement and inspection device such as a SEM or the like and a corresponding measuring/inspection method, an electron beam (referred to also as electron ray, electron probe or the like) is irradiated onto a sample such as a wafer while being scanned, and energy such as secondary electrons or the like thus generated is detected. Then, based upon the detection, an image, such as a measured image, an inspection image or the like, is generated by a signal processing, image processing or the like, and based upon the corresponding image, measurements and inspections are carried out.

For example, in the case of an inspection device and an inspection function for carrying out a defect inspection on a circuit pattern, by using an inspection image, images of similar circuit patterns are mutually compared, and a portion having a large difference between them is determined and detected as a defect. Moreover, in the case of a measuring device and a measuring function for carrying out measurements on a circuit pattern, since the amount of generation of secondary electrons or the like fluctuates depending on a surface shape such as irregularities or the like of a sample, based upon evaluation processes of a signal of the secondary electrons, fluctuations or the like of the surface shape of the sample can be confirmed. In particular, by utilizing the fact that the signal of secondary electrons abruptly rises or falls at an edge portion of a circuit pattern, the edge position within a circuit pattern image of the corresponding circuit pattern is estimated so that the dimension value or the like of the circuit pattern can be measured. Then, based upon the measuring results, the quality of the pattern processing of the corresponding circuit pattern can be evaluated.

As the prior art example relating to the above-mentioned measurement and inspection, Japanese Patent Application Laid-Open Publication No. 2006-93251 (Patent Document 1), Japanese Patent Application Laid-Open Publication No. H07-326314 (Patent Document 2), Japanese Patent Application Laid-Open Publication No. 2009-32445 (Patent Document 3) and the like are exemplified. Patent Documents 1 to 3 disclose structural examples of a measurement and inspection device of the SEM system.

Patent Document 1 discloses a technique or the like for measuring a pattern dimension at a desired position on the cross-sectional shape of a pattern. In Patent Document 1, "a dimension measuring method and its device" are proposed in which "by using a scanning-type electron microscope, a secondary electron image of a sample is acquired, an image profile of a pattern for use in measuring a dimension in this acquired secondary electron image is formed by using the secondary electron image, and a model profile, which is most coincident with an image profile formed among a plurality of model profiles corresponding to a plurality of patterns obtained from respective secondary electron images of a plurality of patterns having known cross-sectional shapes and dimensions and having different shapes that have been preliminarily stored, is retrieved, and by using information of the model profile obtained by this retrieval, a pattern dimension is found."

Patent Document 2 discloses "in a scanning charged particle beam device for irradiating an insulating object or a semiconductor sample with a primary charged particle beam and for detecting a signal obtained from the sample, such a scanning charged particle beam device as to remarkably reduce an electrification phenomenon of the sample can be realized", etc.

Patent Document 3 discloses objects or the like, such as "to provide an inspection device and an inspection method using a scanning electron microscope that can detect an electron beam image with high precision and also eliminate the limitation of an AD conversion element relating to a low sampling rate that causes a problem at the time of detection." Moreover, with respect to the objects, for example, a method is proposed in which "for each of N-number of continuous digital values included in the sampling signal, the N-number of digital values are successively added to generate a digital luminance signal having a 1/N frequency of the sampling frequency."

RELATED ART DOCUMENTS

Patent Documents

Patent Document 1: Japanese Patent Application Laid-Open Publication No. 2006-93251
Patent Document 2: Japanese Patent Application Laid-Open Publication No. H07-326314
Patent Document 3: Japanese Patent Application Laid-Open Publication No. 2009-32445

SUMMARY OF THE INVENTION

Problems to be Solved by the Invention

The following description will explain an electron beam scanning system in a conventional measurement and inspection device and a method thereof, such as an SEM or the like. For example, a normal scanning process in a CD-SEM (measurement SEM) is referred to as a TV-scanning process, a raster scanning process or the like, and its scanning time per one screen is set to, for example, about 26 μs. Moreover, based upon the TV-scanning as its standard, a scanning speed n-times as fast as the speed is referred to as an n-fold speed scanning or the like, and, for example, in the case of 4-fold speed scanning, the scanning time per one screen is set to about 26/4=6 μs.

In the conventional raster scanning system, TV scanning system or the like, problems have been raised in a difference in the amount of electrostatic charge in samples (see FIG. 2, 3 or the like to be described later, in detail) depending on the scanning direction, the scanning speed, the pattern shapes of the sample, or the like. Due to the difference in the amount of electrostatic charge of samples, further problems, such as a lowered image contrast or a disappeared edge portion of the circuit pattern, in a detected image of secondary particles, are raised, with the result that low precision or incapability is caused in observations of a sample surface state, that is, measurements or inspections thereof.

In order to solve the above-mentioned problems with the precision of measurements/inspections, it is effective to shorten the irradiation time per unit region, that is, to reduce the irradiated charge density, so that the amount of electrostatic charge of the sample is lowered or appropriately adjusted. For this purpose, effective methods are to lower a probe current relating to the electron beam irradiation, and to increase a scanning speed to, such as an n-fold speed, that is, to achieve a high-speed scanning process.

In the case when the irradiated charge density per unit region is lowered, in order to ensure a signal-to-noise ratio (SNR) of an image for measurements/inspections, for example, a process for integrating or adding a plurality of images (referred to also as "frames") to one another is required, or effectively used.

In an attempt to lower the probe current without changing the scanning speed, since a long image-capturing time is required, a low throughput is caused. Therefore, in an attempt to achieve high speed or efficient measurements/inspections, it is necessary to increase the scanning speed without changing the probe current, that is, to provide a high-speed scanning process.

A secondary electron signal detection system (see FIG. 5 or the like to be described later in detail) in the conventional measurement and inspection device of the SEM system is provided with a detector, such as a PMT or the like, a preamplifier circuit, an analog signal processing and amplifying unit serving as a secondary electron signal detector and an analog/digital conversion unit (ADC) or the like. In the case when a high-speed scanning process is carried out by the conventional detection system, since the scanning time per unit region such as 1 line, 1 pixel, or the like, becomes shorter, the sampling speed in the ADC needs to be made faster. For this reason, the overall detection-system circuit including the ADC needs to have high-speed operations or a wide bandwidth.

In the measurement and inspection device of the SEM system, in order to realize measurements/inspections with high precision suitable for samples having various materials, patterns and the like, the above-mentioned preparation for a high-speed scanning process is required for a circuit of detection system including the above-mentioned secondary electron signal detection unit (analog signal processing and amplifying unit and ADC) or the like. Moreover, preparations, which can achieve scanning controls at various scanning speeds, including not only a high-speed scanning operation at a predetermined speed, but also a low speed scanning operation, such as the conventional TV scanning, and a high-speed scanning operation at its n-fold speed, are desirably carried out.

However, in the case when in order to suitably provide the above-mentioned high-speed scanning and high-speed sampling processes, the circuit such as the secondary electron signal detection unit of the detection system is allowed to have a wide bandwidth, the following problems are raised when a low-speed scanning process is carried out by using the corresponding circuit configuration.

(1) The first problem is an increase in noise signal, in other words, a reduction in a signal-to-noise ratio (SNR). Sources of noise signal include shoot noises of a primary electron beam and a secondary electron beam, shoot noises of a fluorescent material and a detector, such as a PMT or the like, and voltage/current noises of circuits of a secondary electron signal detection system. These noise signals are considered to be random noises that basically have a Gaussian distribution characteristic. The size of random noise is in proportion to the root (square root) of a frequency band. For example, when the frequency band expands 4 times larger, the size of the noise signal becomes 2 times greater. In a high-speed scanning process, in order to set the irradiation amount of a sample relative to the TV scanning (1-fold speed) to the same level, the frame integration times increase in response to the scanning speed as described earlier. For example, in the 4-fold speed scanning process, the frame integration times are 4. Theoretically, the size of a random noise signal is reduced by the root of the frame integration times. In the case of a high-speed scanning process, the noise amount that increases by the widened bandwidth of the above-mentioned circuit of a detection system can be reduced by the frame integration. Therefore, in the case of the above-mentioned high-speed scanning process with the widened bandwidth, since the overall cancellation is carried out, the SNR can be made to the same level as the conventional system.

On the other hand, in the case when measuring/inspecting processes are executed at a low-speed scanning process as in the case of the conventional TV scanning by using the above-mentioned circuit of the detection system with the widened bandwidth, since the frame integration times are unchanged from the viewpoint of the throughput, the SNR is lowered by the increase of noise signal due to the wide bandwidth, causing a problem of the degradation of precision.

(2) The second problem is a failure in obtaining a pulse signal at the time of sampling, that is, in other words, leakage of a detection signal of secondary electrons. In a measuring device of the SEM system, for example, a signal derived from an irregular edge of the surface pattern of a sample is detected, and formed into an image so that the dimension of the corresponding pattern is measured. In general, this detection signal is a pulse signal represented on a probabilistic basis. That is, on the surface of the sample, the probability of appearance of a pulse signal becomes higher at portions where the above-mentioned edge pattern is located and the number thereof becomes greater. On the other hand, at portions where no edge pattern is present, the probability of appearance of the pulse signal becomes low and the number thereof becomes lower. Since these are probabilistic phenomena, an image processing or a data processing is carried out on these detection signals or pulse signals by using integration or addition of the plurality of image frames, as described earlier, so that general detection results can be obtained (see FIG. 3 or the like). Thus, an image, which is represented as gradation values of pixels in accordance with the probability or number of appearances of the pulse signals for each of places on the sample surface, can be obtained.

The width or the interval of the pulse signals forming the above-mentioned detection signal is determined by a probe electric current and a frequency response characteristic, or the like. In the case when the sampling speed is slow in response to a scanning speed and when the sampling cycle is longer than the width or interval of the corresponding pulse signals, a phenomenon of a failure in obtaining the pulse signal occurs at the time of sampling in the ADC. Consequently, the gradation value of pixels in an image obtained in response to a digital signal of the corresponding sampling becomes lower. That is, the SNR is lowered, causing degradation in the measuring precision.

(3) Moreover, the third problem is a saturation phenomenon of circuits. This is a phenomenon in which, in a circuit of the above-mentioned secondary electron signal detection system, when the amplitude of an input signal from the detector and amplifier circuit is large relative to an analog signal processing and amplifying unit, an output signal is distorted because the maximum output level of the amplifying unit is exceeded. Since the input signal to the ADC is subsequently distorted, the precision of the measurement/inspection is lowered in the same manner.

In a conventional measuring device of the SEM system, deviations in the amplitude of pulse signals forming the above-mentioned detection signals are large due to the materials, patterns or the like of the sample. For example, in an example shown in FIG. 10 to be described later, a difference in amplitudes is large between pulse signals a1 and a2. In the case of the pulse a1 having a large amplitude, the possibility of distortion becomes high since the maximum output level is exceeded as described above. Moreover, in the case of the pulse a2 having a small amplitude, when it is too small, it becomes difficult to detect a gradation value or information.

Moreover, in the conventional measuring device of the SEM system, some of those devices have a function for adjusting the brightness and contrast of an image (ABCC: Auto Brightness & Contrast Control) as one function for obtaining an image with high precision. In the case of this ABCC function, for example, by using histograms of an image obtained by the respective measurements, the gain of the PMT of the detector and the offset value of the circuit of the secondary electron signal detector are controlled from the control unit. With this arrangement, it is possible to automatically adjust the brightness and the contrast of an image. Moreover, in the case of a measurement and inspection device of another system having another function, it is necessary to appropriately set values, such as the above-mentioned gain, in the circuit of the above-mentioned secondary electron signal detection system in order to obtain an image with high precision.

In the case when the gain of the PMT of a detector is set so as not to have a failure in obtaining a pulse signal having a small amplitude by using the above-mentioned ABCC function or another setting function, there is a possibility that in the case of a pulse signal having a large amplitude, the signal is saturated in the middle of an amplifying process in the circuit of the above-mentioned detection system, in particular, in the analog signal processing and amplifying unit. Upon occurrence of such a saturation phenomenon, correct circuit operations are not ensured, and undesired phenomena, such as ringing, oscillation or the like, tend to occur. In the worst case, the saturated parts are damaged and become unrecoverable. Since along with high-speed scanning, rising-up and falling-down speeds of an oscillation pulse of the electron beam become higher, the possibility of occurrence of the saturation phenomenon in the circuit also becomes higher due to a pulse signal having a large amplitude.

Additionally, in a general-use light receiving element, an amplifier circuit, or the like not limited by those of the SEM, techniques, such as a clamp circuit or the like, for suppressing the voltage to a fixed voltage (maximum output level) or less so as to prevent the output saturation relative to a large input have been conventionally known. As will be described later, the present claimed invention, which does not simply use the above-mentioned clamp circuit or the like so as to prevent the above-mentioned saturation phenomenon, is provided with means or the like for desirably controlling the maximum output level or the like of the clamp circuit.

Additionally, in the prior art examples of Patent Documents 1 to 3 or the like, there are no descriptions about countermeasures against the above-mentioned problems, such as means for handling various scanning speeds including the high-speed scanning and low-speed scanning, and other problems caused by the widened bandwidth of the secondary electron signal detection system, such as (1) SNR lowering, (2) failure in obtaining pulse signals and (3) circuit saturation, and methods for solving these problems.

Moreover, Patent Document 3 has described means for a digital addition process for a sampling signal, which can contribute to the improvement of SNR or the like. However, in the case of this technique, the limited condition that the band of analog signals to be handled is only 1/N times the sampling frequency is imposed.

In view of the above-mentioned problems, the present invention relates to a measurement and inspection device of a scanning-type electron beam system, or the like, and its object is to provide such a device as to handle various scanning speeds including a high scanning speed and a low scanning speed, and a technique that can realize measurement and inspection processes with high-speed and high precision, even in the case when the secondary electron signal detection system is allowed to have a wide bandwidth. In particular, the technique can realize (1) improvement of SNR, (2) prevention of failure in obtaining a pulse signal and (3) prevention of circuit saturation, or the like.

Means for Solving the Problems

In order to achieve the above-mentioned objects, the typical embodiment of the present invention relates to a measurement and inspection device of a scanning-type electron beam system and a measurement and inspection method thereof, and is characterized by including the following configuration.

(1) The present embodiment relates to a measurement and inspection device that carries out at least either a measuring process or an inspecting process on a sample by using a scanning type electron beam system, and the device includes an irradiation unit for irradiating the sample with an electron beam, while scanning and controlling the beam thereon, a detection unit for detecting secondary electrons generated from the sample as an electric signal, an analog signal processing and amplifying unit to which a detection signal of the detection unit is inputted to be subjected to an analog signal processing and amplified, and then outputted, an AD conversion unit to which the outputted analog signal of the analog signal processing and amplifying unit is inputted to be converted to a digital signal, and then outputted, a processing unit to which the outputted digital signal of the AD conversion unit is inputted to generate data information including an image for use in the measurements or the inspections and also to output the resulting data information, and a band switching unit for switching a frequency band of the analog signal to be passed through the analog signal processing and amplifying unit among a plurality of states in association with a scanning speed of the scanning control and a gain of the detection unit.

(2) The measurement and inspection device of the present embodiment includes a control unit for controlling the entire operations including the measurements or inspections and for storing and managing data information relating to the measurements or inspections, an interface unit for providing a user interface for use in work including the measurements or inspections, an electron optical system for irradiating an electron beam onto the sample and an electron optical control unit for controlling the electron optical system, a scan controlling unit for carrying out a scan controlling process upon irradiating the electron beam onto the sample, a detector for detecting secondary electrons generated from the sample upon irradiation of the sample with the electron beam as an electric current signal, a preamplifier for converting an output current signal from the detection unit to a voltage and for pre-amplifying the voltage to be outputted, an analog signal processing and amplifying unit for receiving input of the output voltage signal from the preamplifier and carrying out an analog signal processing on the signal and amplifying the signal to be outputted, an AD conversion unit to which the outputted analog signal of the analog signal processing and amplifying unit is inputted to be converted to a digital signal and then outputted, an image processing unit that receives input of the output digital signal of the AD conversion unit, generates data information including an image for use in the measurements or the inspections and outputs the data information to a user through the interface unit, and a band switching unit for switching a frequency band of the analog signal to be passed through the analog signal processing and amplifying unit among a plurality of states in accordance with the scanning speed of the scanning control, the gain of the detector, and an input range of the AD conversion unit.

(3) Moreover, the measurement and inspection device of the present embodiment further includes adjusting an amplifying level by a variable gain amplifier of the analog signal processing and amplifying unit in association with the scanning speed of the scanning control, the gain of the detector, the frequency band, and the input range of the AD conversion unit.

(4) Alternatively, the measurement and inspection device of the present embodiment further includes a clamp output adjusting unit for carrying out adjustments so as to limit a maximum output level of a clamp amplifier of the analog signal processing and amplifying unit in association with the scanning speed of the scanning control, the gain of the detector, the frequency band and the input range of the AD conversion unit.

Effects of the Invention

In accordance with the typical embodiment of the present invention, the measurement and inspection device of the scanning type electron beam system related thereto can be applied to various scanning speeds including a high-speed scanning process and a low-speed scanning process, and also realize high-speed measurements and inspections with high precision even when applied to a secondary electron signal detection system with a widened bandwidth. In particular, the following advantages can be obtained: (1) SNR improvement, (2) Prevention of failure in obtaining pulse signals and (3) Prevention of circuit saturation.

BRIEF DESCRIPTIONS OF THE DRAWINGS

FIG. 8(*a*) is an example of a GUI screen display according to the prior art, and FIG. 8(*b*) is an example of a GUI screen display according to the first embodiment;

DETAILED DESCRIPTION OF PREFERRED EMBODIMENTS

Hereinafter, the embodiments of the present invention will be described in detail with reference to the drawings. Note that, in all drawings for explanation of the embodiments, the same members basically have the same signs and their repetitive explanation will be omitted. In the following description, the measurement and inspection device and the measurement and inspection method include a case for carrying out only a measuring operation, a case for carrying out only an inspecting operation and a case capable of carrying out both of the inspecting and measuring operations.

Outline, Etc.

The measurement and inspection device according to the present embodiment (FIG. 1, FIG. 5 or the like) is provided with a function for controlling measuring and inspecting processes to be applied to various scanning speeds, and a means for solving problems raised at the time of achieving the function, such as a reduction of SNR, a prevention of a failure in taking a pulse signal at the time of sampling, and a prevention of a saturation phenomenon or the like of the circuit. As the means, various functions (such as a band-switching function, a variable gain adjusting function and a clamp output adjusting function), which desirably and variably control parameter values, such as a band, an amplifying level and a maximum output level control, in association with a characteristic, such as a gain or the like, of a detector (107) on the preceding stage, and characteristics of an input range and a sampling frequency of an ADC (52) on the succeeding stage, in an analog signal processing and amplifying unit (51), are installed. Moreover, a function for allowing the user to easily and flexibly set the values of the respective functions on a GUI screen is also installed. Thus, it becomes possible to realize high-speed measuring and inspecting processes with high precision.

First Embodiment

Referring to FIGS. 1 to 12, the following description will explain a measurement and inspection device of a scanning-type electron beam system according to the first embodiment of the present invention and a measuring and inspecting method by using such a device, in comparison with a prior art example.

[Measurement and Inspection Device]

Figure 1:
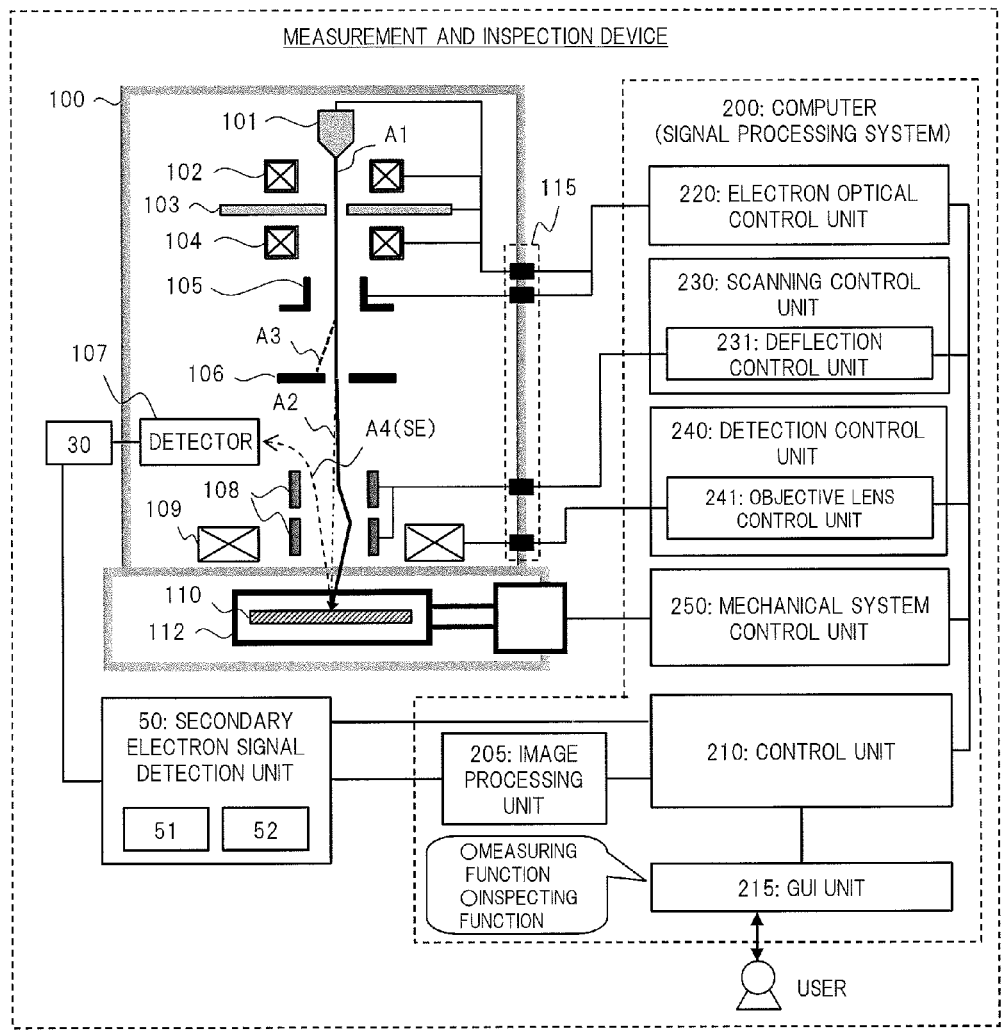
FIG. 1 is a diagram illustrating an overall configuration of a measurement and inspection device of a scanning-type electron beam system according to a first embodiment of the present invention.

FIG. 1 shows a configuration of an overall system including the measurement and inspection device according to the first embodiment. The measurement and inspection device of the first embodiment corresponds to an applied example thereof to an electron microscope device (SEM) of a scanning-type electron beam system having a function for automatically measuring and inspecting a semiconductor wafer serving as a sample 110. The present measurement and inspection device is provided with a measuring function for measuring dimension values of a surface pattern of the sample 110 and an inspecting function for detecting an abnormal portion, a defective portion or the like of the corresponding pattern.

The present measurement and inspection device has a configuration provided with a mechanical system including a column 100 serving as a main body and a sample stage 112 serving as a stage on which a sample 110 or the like is mounted, a computer 200 serving as a signal processing system, and a secondary electron signal detection unit 50 or the like. The column 100 has a built-in optical system of an SEM system and a detector 107. The secondary electron signal detection unit 50 is connected to the detector 107 of the column 100 through a preamplifier (preamplifier circuit) 30, and the secondary electron signal detection unit 50 is connected to the computer 200. The preamplifier circuit 30 and the secondary electron signal detection unit 50 are constituted by, for example, an electron circuit substrate or the like. The substrate of the preamplifier 30 or the like may be connected to, for example, a portion close to a side face (inside or outside) of the column 100. The computer 200 may be configured by, for example, a PC or the like. The computer 200, the secondary electron signal detection circuit 50 and the like are stored in, for example, a control rack. Moreover, the gaps among the column 100, the electronic circuit substrate and the computer 200 or the like are connected with one another with cables or the like. Additionally, a mode in which the computer 200 and the other substrates (30, 50) are integrally formed may be used.

The computer 200 is provided with an image processing unit 205, a control unit 210, a GUI (Graphical User Interface) unit 215, an electron optical control unit 220, a scanning control unit 230, a detection control unit 240, a mechanical system control unit 250, etc. This is realized by, for example, a software programming process or a dedicated circuit processing by the use of known elements, such as a processor, a memory, or the like. Additionally, the computer 200 and the control unit 210 or the like are provided with both of a measuring function and an inspecting function; however, this may be provided with only one of the functions thereof.

The control unit 210 carries out processes for controlling the entire units and the respective units of the present measurement and inspection device and a measuring/inspecting process thereof, in accordance with an instruction input given by the user through a GUI screen, or the like, by the GUI unit 215. Upon executing the measuring/inspecting process, the control unit 210 acquires data information including an image detected or generated through the secondary electron signal detection unit 50 and the image processing unit 205, and displays the data on the GUI screen by the GUI unit 215. The control unit 210 stores the above-mentioned data information including the image and setting information of the measuring/inspecting process, or the like, in a storage means, such as a memory, a storage or the like, and manages the data.

The GUI unit 215 carries out a process for supplying the GUI screen to the user who executes the measuring/inspecting process. The user is allowed to selectively execute the measuring function and the inspecting function with respect to the measuring/inspecting work on the GUI screen, and also to give various operation instructions and view the data information. The GUI unit 215 provides a screen through which measuring/inspecting conditions or the like are inputted, a screen for use in displaying the measuring/inspecting results in a two-dimensional image or the like, etc. The GUI unit 215 includes an input/output device, such as a key board, a mouse, a display or the like, and a communication interface unit, or the like. Thus, the measuring function and inspecting function can be selectively executed.

The electron optical control unit 220 is configured so as to include a blanking control circuit or the like, and in accordance with controls from the control unit 210, controls irradiation processes of an electron beam (A1, A2 or A3) by driving the optical system including an electron gun 101 inside the column 100, lenses (lens 102 and lens 103), a diaphragm 103, blanking control electrodes 105 or the like. Thus, the electron optical system including optical lenses and the like inside the column 100 is controlled.

The scanning control unit 230 is configured to include a deflection control unit 231, and in accordance with controls from the control unit 210, carries out a scanning control process by carrying out an irradiation of the electron beam (A2) onto the sample 110, by driving the portion including a deflector 108 in the column 100. Moreover, the scanning control unit 230 realizes a scanning control function corresponding to a scanning mode of each of scanning speeds to be described later, and carries out a scanning control operation in accordance with the specified scanning speed. The deflection control unit 231 controls the scanning caused by the deflection of the electron beam by applying a deflection control signal to the deflector 108.

The detection control unit 240 is configured to include an objective lens control unit 241, etc., and in accordance with controls from the control unit 210, carries out a detection control process on secondary electrons A4 (SE) from the sample 110 by the detector 107, by driving the portion including the objective lens 109 inside the column 100. Moreover, the objective lens control unit 241 controls a detection process of the secondary electrons (SE) A4 by the irradiation of a beam A2 onto the sample 110, by applying an objective lens control signal to the objective lens 109.

Figure 2:
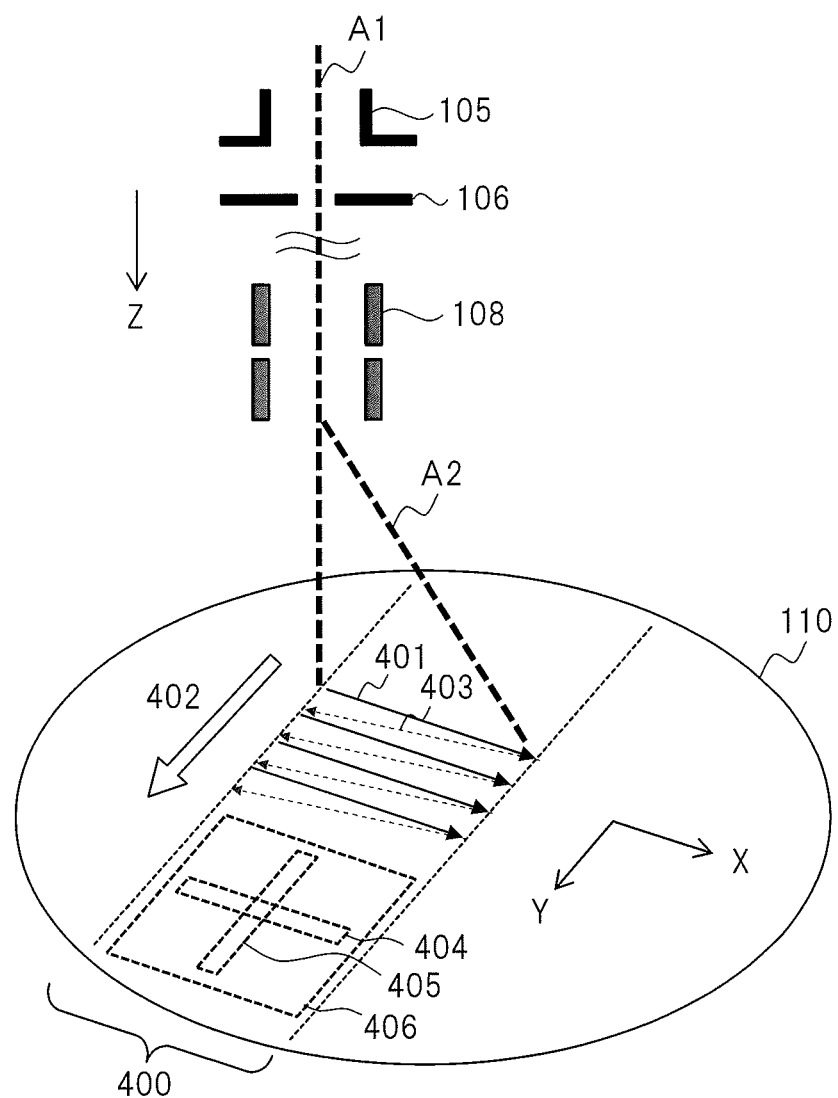
FIG. 2 is a diagram illustrating a scanning system according to the prior art and the present embodiment.

In accordance with controls from the control unit 210, the mechanical system control unit 250 controls operations of the mechanical system such as the sample stage 112 or the like, by applying control signals thereto. For example, as shown in FIG. 2, the sample 110 on the sample stage 112 is controlled so as to be shifted in X, Y directions or the like, in association with the scanning control of the electron beam.

Reference numeral 115 represents a driver circuit including its terminals, which is used upon driving and controlling the corresponding electrodes or the like from the above-mentioned respective control units (220, 230, 240).

The column 100 inside of which is kept in a vacuum state is provided with: the electron gun 101, the first condenser lens 102, the diaphragm 103, the second condenser lens 104, the blanking control electrodes 105, an aperture 106, the deflector 108, the objective lens 109, and the like. Moreover, inside the column 100, the detector 107 and the like constituting elements for forming a detection system are installed.

The electron gun 101 emits a beam A1 serving as a primary electron beam. The first condenser lens 102 is a focusing lens through which the beam A1 emitted from the electron gun 101 is allowed to pass. The second condenser lens 104 is a focusing lens through which the beam A1 focused by the diaphragm 103 is allowed to pass. The beam A1 emitted from the electron gun 101 is focused while passing through the first condenser lens 102, the diaphragm 103 and the second condenser lens 104. The blanking control electrodes 105 is used upon carrying out a blanking control in which the shutoff of the beam irradiation is on/off controlled. Normally, in an off-state of the shutoff, the beam, as it is, is allowed to pass between the blanking control electrodes 105, and also to pass through the aperture 106 as in the case of A2. In an on-state of the shutoff, the beam is bent between the blanking control electrodes 105 to be shutoff without passing through the aperture 106 as in the case of A3. The beam A2 that has passed through the aperture 106 is deflection-controlled by the deflector 108. That is, the beam A2, which has been subjected to a scanning control including the deflection control, is allowed to pass through the objective lens 109 and the like, and irradiated onto the sample 110 on the sample stage 112, while being scanned. Secondary electrons A4 (SE) generated from the sample 110 by the irradiation onto the sample 110 with the electron beam A2 are made incident on the detector 107, and detected as an electric signal/analog signal (referred to also as a detection signal, a pulse signal, or the like).

The analog signal detected in the detector 107 is subjected to a current (I) to voltage (V) conversion in the preamplifier circuit 30 and a pre-amplifying process, and then inputted to the secondary electron signal detection unit 50. In the secondary electron signal detection unit 50, after having been subjected to an analog signal processing and an amplifying process by an analog signal processing and amplifying unit 51 to be described later, the resulting signal is subjected to a sampling process in which the analog signal is converted to a digital signal by the ADC 52. The digital signal or the sampling data are inputted to the image processing unit 205.

In the image processing unit 205, by using the digital signal or sampling data outputted from the secondary electron signal detection unit 50, an image processing is carried out in accordance with the measuring or inspecting process so that a two-dimensional measured image or inspected image is generated. In the case of a measuring function, the image processing unit 205 generates a measured image so that calculations or the like are carried out on pattern dimensional values within the image. Moreover, in the case of an inspecting function, it generates an inspected image so that a process for detecting/determining a defect or the like within the image is carried out.

The control unit 210 acquires data information including the corresponding image, and stores the information in a memory or the like in the computer 200. Moreover, through the process of the GUI unit 250 from the control unit 210, a GUI screen including the corresponding image and data information is generated and displayed to the user. For example, in the case of the measuring function, dimensions or the like of a circuit pattern are measured based upon the information within the measured image. In the case of the inspecting function, an abnormal state, a defect or the like is detected based upon the information within the inspected image.

[Scanning System]

FIG. 2 shows a TV scanning system or a raster scanning system as a scanning system for the prior art and the present embodiment, which serves as the premise technique. Reference numeral 400 indicates a two-dimensional region that is a target for scanning and irradiating processes by the primary electron beam (A1, A2) on the surface of the sample 110. Additionally, the figure is illustrated by defining the plane of the sample 110 as X, Y coordinates, with a beam irradiating direction perpendicular thereto being set as a Z-direction. With respect to beam orbits within the region 400, 401 indicates a beam scanning direction (X-direction corresponding thereto), and 402 indicates a beam shifting direction (Y-direction corresponding thereto). Reference numeral 403 indicates a returning orbit to the leading point of the next line in the Y-direction, after one line scanning process has been carried out in the X-direction corresponding to the 401 direction, and an irradiation shutoff at that time. Additionally, the beam shifting direction (Y) can be realized either by the control on the beam side, or by the control on the mechanical system side. Reference 404 indicates an example of a lateral line region corresponding to the beam scanning direction (X) and 405 indicates an example of a longitudinal line region corresponding to the beam shifting direction (Y).

In the above-mentioned scanning system, secondary electrons are discharged from the sample 110 by a mutual interaction between the primary electron beam made incident on the sample 110 and the sample 110. The number of discharged electrons per one of the incident electrons is referred to as a secondary electron discharge rate ($\eta$). In this case, $\eta$ represents an irradiation energy of the beam, which is dependent on the material, shape or the like of the sample 110. In the case when $\eta<1$ is satisfied, since negative charge is accumulated on the sample 110 by the beam irradiation, a negatively charged state is caused. On the other hand, in the case when $\eta>1$ is satisfied, since positive charge is accumulated on the sample 110 by the beam irradiation, a positively charged state is caused.

In this case, even when the beam scanning process is carried out, for example, on the sample 110 negatively charged as described above and secondary electrons from the sample 110 are detected to obtain a secondary electron image as the resulting image, a negatively charged portion of the sample 110 forms a brightly shining portion, making it incapable to observe the surface state of the sample 110, that is, to carry out measurements and inspections thereon, or causing low precision thereof. In contrast, even when the beam scanning process is carried out on the sample 110 positively charged and a secondary electron image is obtained, a positively charged portion of the sample 110 forms a dark portion, also making it incapable to observe the sample, or causing low precision thereof. In particular, the above-mentioned phenomena become conspicuous when the sample 110 is made of an insulating material.

Moreover, the amount of electrostatic charge is also dependent on the pattern shape of the sample 110 and the scanning system to be carried out thereon. For example, in the case when a line in the X-direction of a pattern is scanned in the raster scanning system, as shown by the lateral line 404 of FIG. 2, since the beam is continuously applied on the lateral line 404 to cause a continuously irradiated region, with the result that the amount of charge to be stored becomes greater, that is, the amount of electrostatic charge becomes greater. Consequently, the electric potential rise due to the electrostatic charge becomes greater, and since the number of secondary electrons drawn back to the sample 110 increases, the image contrast is lowered. On the other hand, as indicated by the longitudinal line 405, in the case when a line in the Y-direction of the same pattern is scanned in the same raster scanning system (supposing that it has the same length and area as those of the lateral line 404), the scanning process is discontinuous and separated to a plurality of portions in the X-direction. That is, the corresponding longitudinal line 405 forms discontinuous irradiated regions. Thus, the continuous irradiation time on the longitudinal line 405 becomes shorter to cause the amount of electrostatic charge to become smaller, thereby making the electric potential rise due to the electrostatic charge smaller. Thus, the number of detectable secondary electrons becomes greater in the longitudinal line 405, and the image contrast becomes better in the longitudinal line 405.

As described above, when longitudinal and lateral lines of a pattern are observed in the raster scanning, the contrast in the lateral line 404 is lowered in comparison with that of the longitudinal line 405 to sometimes cause, for example, a disappearance of a line edge. That is, a problem is raised in the precision of measurements/inspections due to influences or the like of the electrostatic charge of the sample 110 caused by the beam scanning.

In order to eliminate the influences of the electrostatic charge, it is effective to make the irradiation charge density per one line smaller. In order to lower the irradiation charge density per one line, the probe current needs to be lowered or the scanning speed needs to be faster. In the case when the irradiation charge density per one line is lowered, a process for integrating or adding a plurality of image frames to one another is required so as to ensure the signal to noise ratio (SNR) of the image. In the case when the probe current is lowered without changing the scanning speed, since a long frame image-capturing time is required, a low throughput is caused. Therefore, it is necessary to make the scanning speed faster without changing the probe electric current. That is, a high-speed scanning process, such as the aforementioned n-fold speed, is required. The high-speed scanning causes a shorter irradiation time per one pixel in comparison with the normal TV scanning. For this reason, the rise of the charging potential within the irradiation time can be lowered.

In the following description, more specifically, the normal TV scanning (one-fold speed) process is compared with, for example, a 4-fold speed scanning process. That is, a case in which one screen is scanned by the TV scanning (one-fold speed) process is compared with a case in which four screens are scanned by a 4-fold speed scanning process, that is, a case in which one screen is repeatedly scanned four times. The scanning process of one screen in the TV scanning and the scanning process corresponding to 4 screens carried out at a 4-fold speed scanning process have the same amount of irradiation in total.

Figure 3:
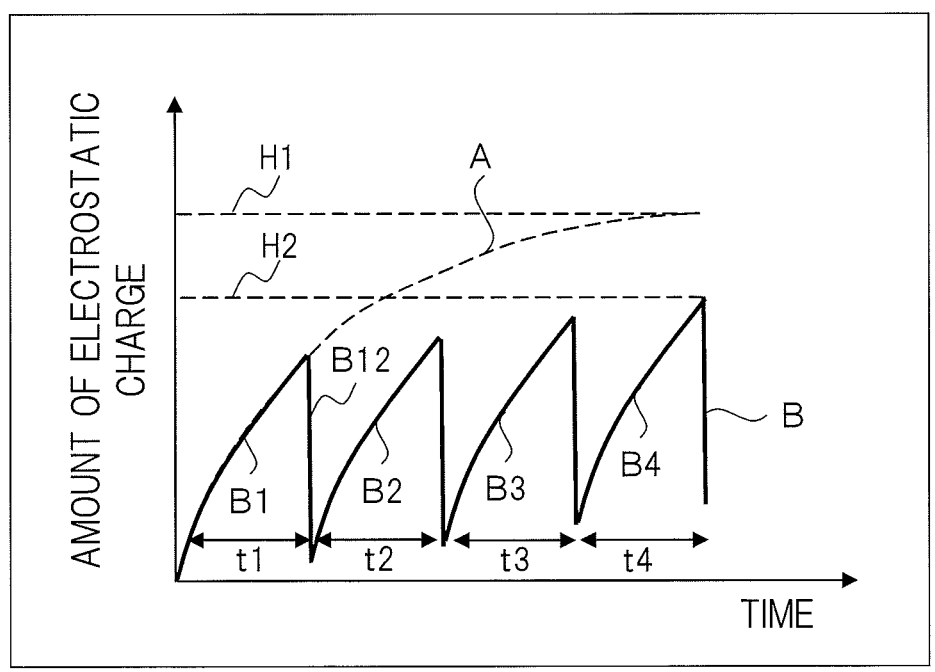
FIG. 3 is a diagram illustrating a difference in amounts of electrostatic charge amounts depending on scanning speeds according to the prior art and the present embodiment.

FIG. 3 shows a difference in the amount of electrostatic charge caused by scanning speeds as the result of comparison between the conventional TV scanning (one-fold speed) and the 4-fold speed scanning process. Here, A (broken line) indicates an orbit of an electric potential change at the time of a TV scanning carried out on one screen of a sample surface. In this case, one screen is defined as a rectangular-shaped region with an X,Y plane such as indicated, for example, by 406 of FIG. 2. B (solid line) indicates an orbit of an electric potential change at the time of a 4-fold speed scanning process carried out on the same screen. The scanning process is repeated 4 times on one screen. H1 represents an electric potential on the sample surface after the TV scanning process, and H2 represents an electric potential on the sample surface after the 4-fold speed scanning process. B1 to B4 indicate respective orbits of electric potential changes at the time of the first to fourth scanning processes carried out at the 4-fold speed scanning. In this case, t1 to t4 respectively indicate scanning periods of time corresponding to B1 to B4. B12 represents an electric potential in the case when after the B1(t1) process for the first time, the sequence transfers to the next second scanning process of B2 (t2) (illustration of the transfer time is omitted from the figure), that is, a reduction in the amount of electrostatic charge.

In the case of the 4-fold speed scanning process, since the irradiation time corresponding to one screen is a ¼ of that of the TV scanning process, the electric potential rise by the electrostatic charge within the corresponding time is smaller than that of the TV scanning. Moreover, in an interval from the scanning process of one screen to the irradiation of the next screen, the electrostatic charge of a pixel is alleviated by secondary electrons from the peripheral pixels and electric charges inside the sample, with the result that as indicated by B12, the electric potential on the sample surface is lowered. For this reason, as indicated by H2 and H1, the electrostatic potential after the scanning processes corresponding to four screens carried out at the 4-fold speed scanning becomes lower in comparison with that of the TV scanning process. Therefore, it is possible to obtain an effect for suppressing the electrostatic charge by using a high-speed scanning process as described above.

Moreover, the detection signal or the pulse signal for use in the secondary electron signal detection system is determined on a probabilistic basis, an image processing or a data processing is carried out on the corresponding pulse signals by using integration or addition of the plurality of image frames. When explained by reference to the example of FIG. 3, systematic detection results can be obtained by carrying out integrating operations on the frames corresponding to four times of B1 to B4. Thus, an image, which is represented as gradation values of pixels in accordance with the probability or number of appearances of the pulse signals for each of places on the sample surface, can be obtained.

[Secondary Electron Signal Detection System of Prior Art]

Figure 4:
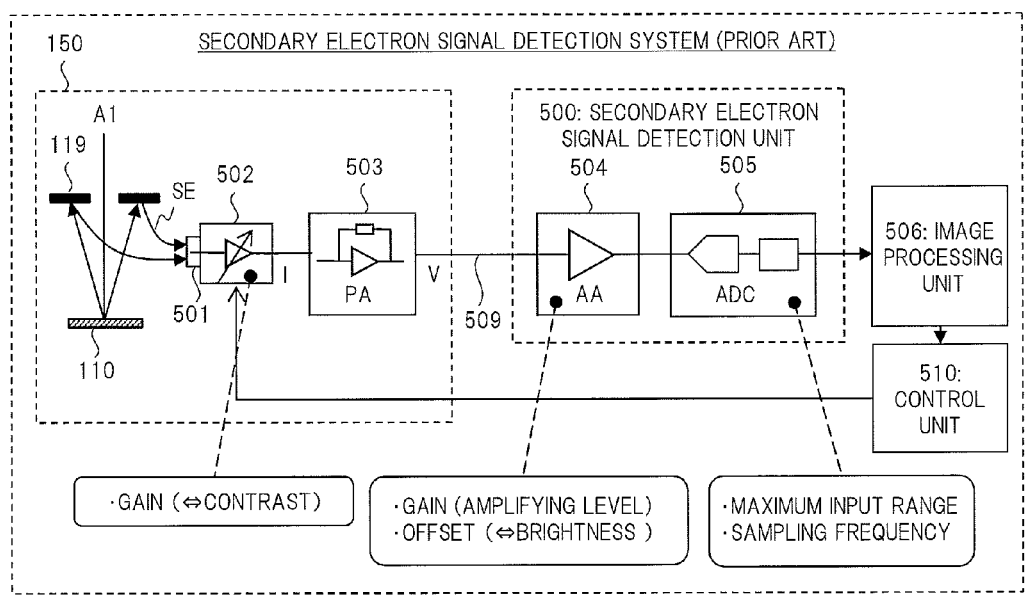
FIG. 4 is a diagram illustrating a configuration, a set value and the like of a secondary electron signal detection system in the prior art device.

FIG. 4 is a Diagram Illustrating a Configuration, Set Values and the like of a secondary electron signal detection system for a measurement and inspection device of an SEM system in the prior art device, which forms a comparative example and the premise with respect to the present embodiment. The secondary electron signal detection system of the prior art is provided with, inside a column 150, a fluorescent substance 501 and a photomultiplier tube (PMT) 502 constituting a detector, a preamplifier circuit 503 installed in the vicinity of a side face of the column 150, a secondary electron signal detection unit 500 installed outside the column 150, and an image processing unit 506 and control unit 510 connected thereto. The secondary electron signal detection unit 500 is provided with an analog signal processing and amplifying unit 504 (indicated by AA) and an analog/digital signal conversion unit (ADC) 505.

Secondary electrons (SE) generated upon irradiation of a sample 110 with a primary electron beam are reflected by a reflection plate 119, and made incident on the fluorescent substance 501. These secondary electrons are converted to photons by the fluorescent substance 501, and then again converted from photons to a signal of an electric current (I) and amplified by the PMT 502. Thus, the PMT 502 detects the secondary electrons as a signal of the electric current (I).

The preamplifier circuit 503 to which the electric current (I) signal of the output of the PMT 502 is inputted converts the current (I) to a voltage (V), and pre-amplifies the voltage and outputs the resulting voltage. The preamplifier 503 is constituted by a current (I) to voltage (V) conversion unit using, for example, an operation amplifier, and an amplifier or the like. The analog signal having the amplified voltage (V) is transmitted through a cable 509, and inputted to the analog signal processing and amplifying unit 504 of the secondary electron signal detection unit 500.

In the secondary electron signal detection unit 500, the analog signal having the voltage (V) from the preamplifier circuit 503 is inputted to the analog signal processing and amplifying unit 504 in synchronism with the maximum input range (for example, about 2 Vpp) of the ADC 505. The analog signal processing and amplifying unit 504 carries out analog signal processing and amplifying operations on the inputted signal having the voltage (V) by using a set gain, and outputs the resulting signal to the ADC 505.

The ADC 505 carries out a sampling process for converting the inputted analog signal to a digital signal, and outputs the resulting digital signal or sampling data to the image processing unit 506. The ADC 505 is constituted by, for example, an AD converter and a digital signal processing circuit.

The image processing unit 506 carries out image processing on the digital signal from the ADC 505, and generates an image for use in measurements and inspections. Alternatively, the image processing unit 506 or the control unit 510 obtains measured results and inspected results by carrying out information processing for measurements or inspections on the generated image.

For example, in the case of the measuring device of the SEM system, detection signals of the secondary electrons (SE) have different sizes of the corresponding output signal depending on the sample to be measured, materials thereof, and electron optical conditions at the time of irradiation, or the like. Therefore, in order to obtain an image with high precision, the gain of the PMT 502 of the detector is automatically controlled from the control unit 510, by using histograms of an image acquired by each of the measurements.

The control unit 510 makes it possible to adjust the contrast or the like of an image by adjusting the gain of the PMT 502 of the detector as the setting value. Moreover, as the setting values, those values for use in adjusting the amplifying level by the gain of the analog signal processing and amplifying unit 504 as well as adjusting the brightness of an image by the use of a circuit offset are proposed. Furthermore, as the setting values, the maximum input range, the sampling frequency or the like of the ADC 505 may be used.

Additionally, in the measurement and inspection device including the secondary electron signal detection system of the prior art in FIG. 4, the fluorescent substance 501 and the PMT 502 forming the detector are disposed inside the column 150, and the preamplifier circuit 503 is disposed in the vicinity of a side face of the column 150. However, the other portions (500 or the like) in the secondary electron signal detection system are not installed in the vicinity of the column 105 because of the relation relative to the size or the like. Therefore, this system is configured such that a signal amplified by the preamplifier circuit 503 in the vicinity of the column 150 is transmitted to the analog signal processing and amplifying unit 504 of the secondary electron signal detection unit 500 installed at a place spaced apart therefrom by, for example, about several meters by way of the cable 509.

In the case of carrying out a high-speed scanning process, as described earlier, for example, a scanning period of time per one line becomes shorter. That is, in an attempt to realize a sampling process suitable for the high-speed scanning process, in the case when the scanning field and the number of pixels are unchanged, the sampling speed per one pixel needs to be made faster. Therefore, not only the ADC 505, but also the entire detection system circuits including the secondary electron signal detection unit 500 for use in converting to a measured image based upon the above-mentioned secondary signal need to be adopted to suitably deal with the high-speed or the wide bandwidth. For example, in the case of the prior art TV scanning, when the sampling speed is 10 Msps, and the necessary band of the detection system circuit is 10 MHz, for example, in an attempt to suitably deal with, for example, an 8-fold speed scanning process, the band of the detection system circuit needs to have a wide bandwidth of 80 MHz or more, which is 8 times wider than the band of 10 MHz.

In view of the above-mentioned premise and problems, the present embodiment has the following configuration.

[Secondary Electron Signal Detection System].

Figure 5:
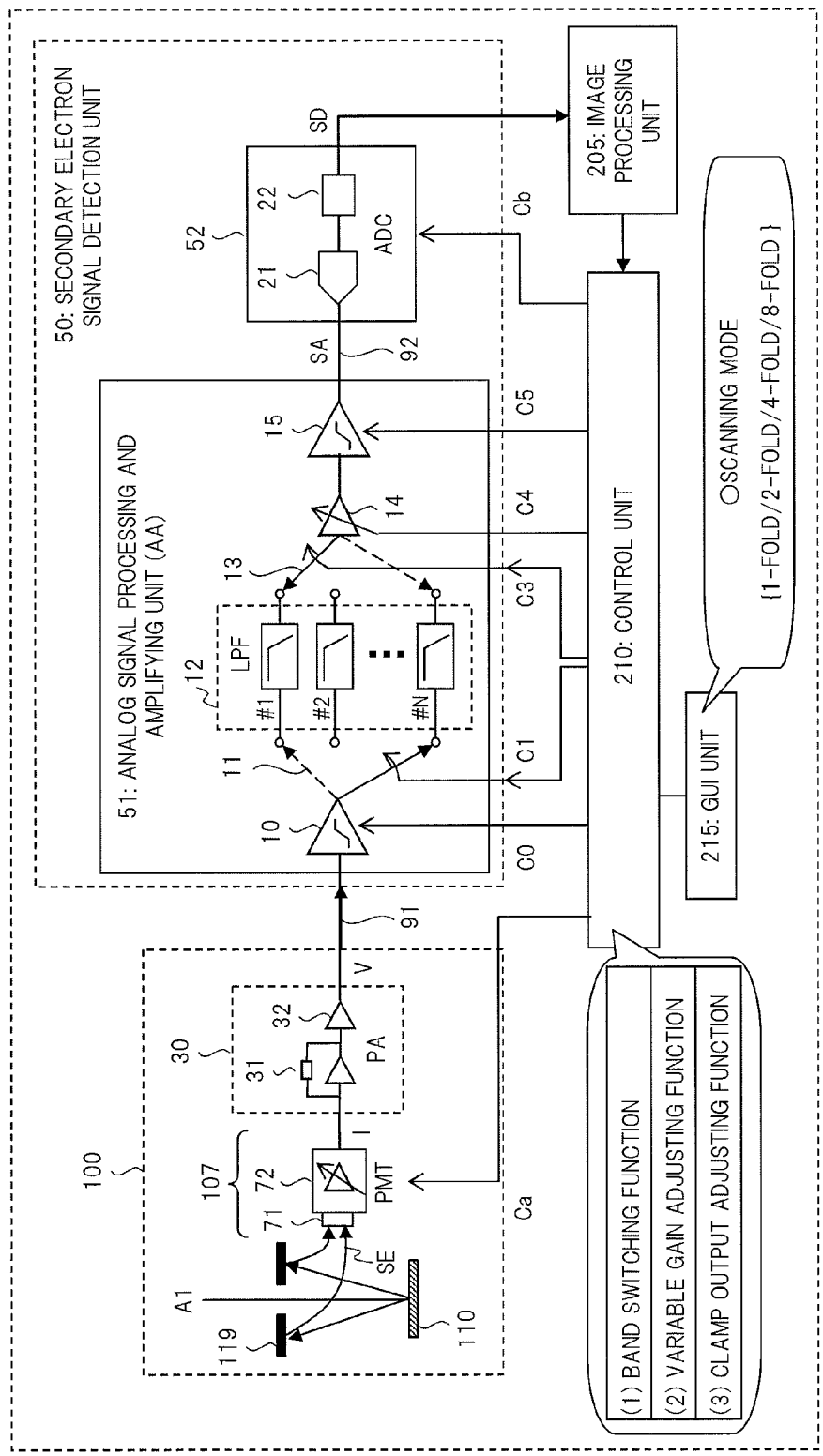
FIG. 5 is a diagram illustrating a configuration of a secondary electron detection system of a measurement and inspection device according to the first embodiment.
Figure 6:
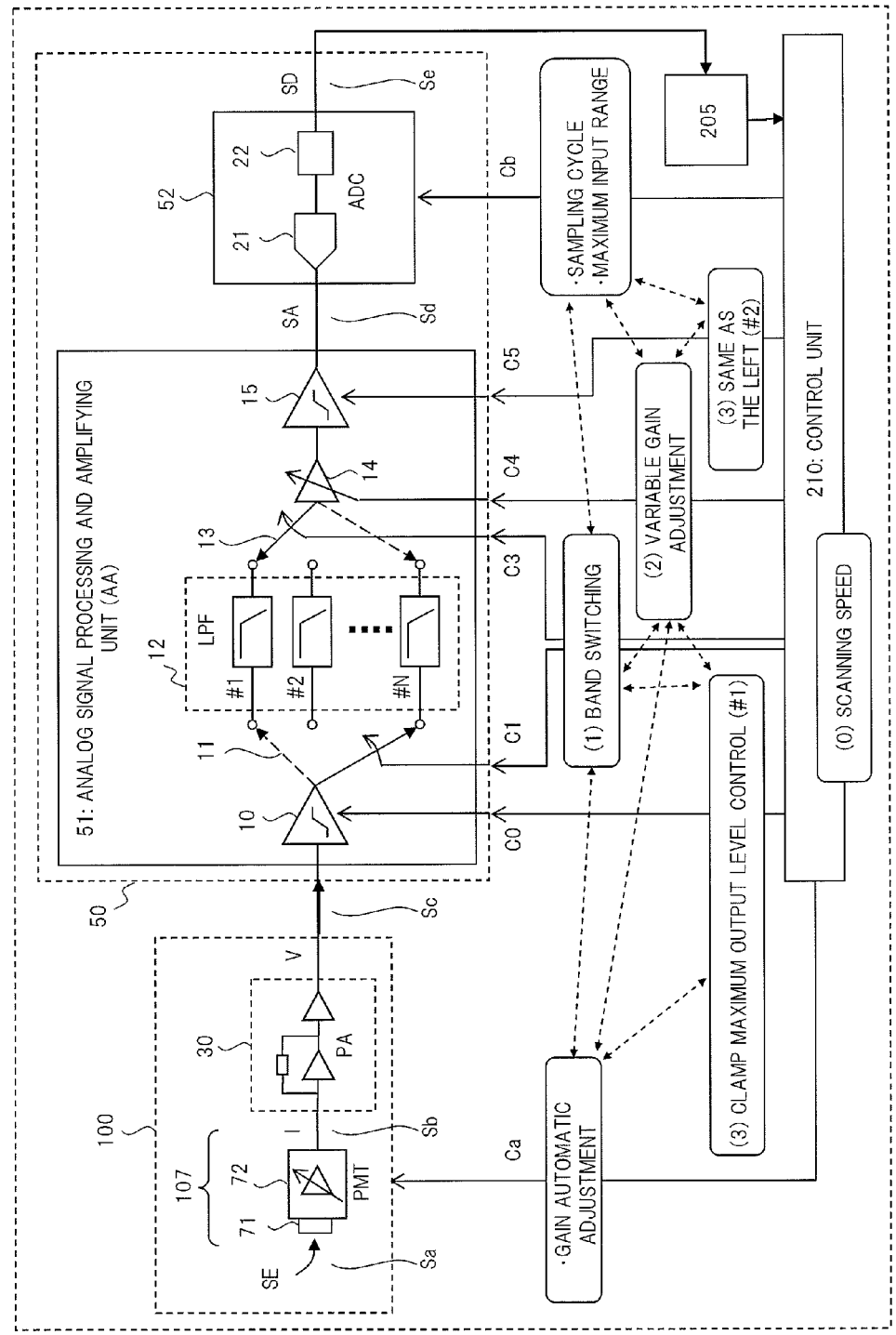
FIG. 6 is a diagram illustrating an outline of control processes of the secondary electron detection system of the measurement and inspection device of the first embodiment.

FIG. 5 shows a configuration of a secondary electron signal detection system in accordance with the measurement and inspection device (FIG. 1) of the first embodiment. Moreover, FIG. 6 shows schematic control processes of the secondary electron signal detection system corresponding to FIG. 5. This system has a configuration in which a novel analog signal processing and amplifying unit 51 or the like is installed.

The present secondary electron signal detection system is constituted by a detector 107 inside the column 100, a preamplifier (preamplifier circuit) 30 installed in the vicinity of a side face of the column 100, a signal detection unit 50 (51 or 52) installed on the outside of the column 100, and the aforementioned image processing unit 205, control unit 210 and GUI unit 215, or the like. The secondary electron signal detection unit 50 has a configuration provided with an analog signal processing and amplifying unit (AA) 51 connected to the succeeding stage of the preamplifier circuit 30 and an analog/digital conversion unit (ADC) 52 connected to the succeeding stage thereof.

For example, in the same manner as in the prior art (FIG. 4), the detector 107 inside the column 100 is constituted by a fluorescent substance 71 and a PMT (photoelectric multiplier tube) 72. Secondary electrons (SE) generated from the sample 110 by the irradiation onto the sample 110 with a primary electron beam are reflected by a reflection plate 119, and made incident on the fluorescent substance 71. The secondary electrons are converted to photons by the fluorescent material 71, and again converted from the photons to a signal of an electric current (I) and then amplified by the PMT 72. Thus, the PMT 72 detects the secondary electrons as a signal of the electric current (I). Not limited by the PMT or the like, the detector 107 may be constituted by another device, such as an APD or the like. Not limited by a detector for secondary electrons (SE), the detector 107 may be prepared as a detector for detecting another energy.

The preamplifier 30 is constituted by, for example, an I-V conversion circuit 31 using an operation amplifier and an amplifier 32 or the like. The preamplifier circuit 30 to which the output current (I) signal of the output of the PMT 72 has been inputted converts a current (I) to a voltage (V) by an I-V conversion circuit 31, and the resulting voltage is pre-amplified by the amplifier 32, and then outputted. An analog signal having the voltage (V) amplified by the preamplifier 30 is transmitted through a first cable 91, and inputted to a first clamp amplifier circuit 10 of the analog signal processing and amplifying unit 51 in the secondary electron signal detection unit 50. The preamplifier circuit 30 may be connected to the vicinity of a side face of the column 100 or the like in the form of an electronic circuit substrate, etc.

The analog signal processing and amplifying unit 51 to which an analog signal or a detection signal derived from secondary electrons (SE) having the output signal (V) from the preamplifier 30 has been inputted in accordance with an maximum input range or the like of the ADC 52, carries out an analog signal processing operation and amplifying operation thereon by using a set gain or the like, and outputs the resulting signal to the ADC 52. The analog signal processing and amplifying unit 51 has a configuration in which the first clamp amplifier 10, a first switch 11, an LPF set 12, a second switch 13, a variable gain amplifier circuit (variable gain amplifier) 14 and a second clamp amplifier circuit 15 are successively connected to one after another. The LPF set 12 has a configuration including a plurality of LPFs (#1 to #N).

The variable gain amplifier circuit 14 of the analog signal processing and amplifying unit (AA) 51 and the AD converter 21 of the ADC 52 are connected to each other by a second cable 92, and an analog signal (SA) serving as an output signal of the AA51 is transmitted thereto through the second cable 92. Additionally, the cables 91 and 92 of the first embodiment are single transmission-type cables.

The ADC 52 carries out a sampling process in which the analog signal (SA) that is analog-processed and amplified in the analog signal processing and amplifying unit 51 is inputted thereto and converted to a digital signal (DA), and outputs the resulting signal to the image processing unit 205. The ADC 52 is constituted by an AD converter 21 for converting the analog signal (SA) to a digital signal (DA) and a digital signal processing circuit 22 or the like that is connected to the succeeding stage thereof.

The image processing unit 205 carries out predetermined image processing operations based upon the digital signal (DA) from the ADC 52, in the same manner as described earlier, so that an image for use in measurements or inspections is generated. Moreover, by carrying out information processing for measurements or inspections on the generated image, the image processing unit 205 or the control unit 210 obtains the measured results and inspected results. The control unit 210 stores and manages the image generated in the image processing unit 205, and also provides a GUI screen for displaying the data information including the image thereon to the user through processes in the GUI unit 215.

For example, in the case of the measuring function, in the detection signal of the secondary electrons (SE), the sizes of its output signal are different depending on the sample 110 serving as the measuring target, electron optical conditions at the time of irradiation, and the like. In order to obtain an image with high precision, statistical processes, such as histograms of images acquired for each of measurements, are carried out so that the gain of the PMT 72 of the detector 107 is automatically controlled from the control unit 210.

By adjusting the gain of the PMT 72 of the detector 107 as a set value from the control unit 210, the contrast or the like of the image can be adjusted. Moreover, as the set values, the amplifying level adjustment by the gain of the analog signal processing and amplifying unit 51 and the image brightness adjustment by the circuit offset can be carried out. Furthermore, as the set values, the maximum input range and the sampling frequency or the like of the ADC 52 may be adjusted.

Moreover, in accordance with the user settings and operations on the screen of the GUI unit 215, the control unit 210 controls parameter values relative to the respective units including the analog signal processing and amplifying unit 51 of the secondary electron signal detection system by using a control signal C1 and the like, in accordance with the specifications of scanning mode corresponding to, for example, scanning speeds (1-fold/2-fold/4-fold/ and 8-fold speed or the like). For example, by adjusting the gain of the PMT 72 of the detector 107 by a control signal Ca, the contrast of the image is adjusted. Moreover, by using a control signal Cb, the maximum input range and the sampling frequency or the like of the ADC 52 can be adjusted.

Furthermore, the control unit 210 adjusts the maximum output level limit value serving as a clamp voltage of each of the first clamp amplifier 10 and second clamp amplifier 15 by using control signals C0 and C5. By switching the first switch 11 and the second switch 13 by using control signals C1 and C3, the LPF to be used is selected among the LPF set 12 so that the circuit frequency band or pass band of the analog signal is switched. Moreover, by using a control signal C4, the amplifying level by the variable gain of the variable gain amplifier 14 is controlled.

The control unit 210 has functions for desirably controlling respective units inside the analog signal processing and amplifying unit (AA) 51 disposed between the detector 107 and the preamplifier circuit 30 as well as the ADC 52, by using the above-mentioned control signals in accordance with the scanning speed and the like. That is, the control unit 210 has (1) band switching function, (2) variable gain adjusting function and (3) clamp output adjusting function. The (1) band switching function carries out a controlling process for desirably switching the circuit frequency band of the AA 51 by using control signals C1 and C3. The (2) variable gain adjusting function carries out a controlling process for desirably switching the amplifying level based upon the variable gain of the AA51, by using a control signal C4. The (3) clamp output adjusting function adjusts the maximum output level limit value on the input side and the output side of the AA 51 by using control signals C0 and C5.

[Secondary Electron Signal Detection Unit 50]

In the analog signal processing and amplifying unit 51, the first clamp amplifier circuit 10 is designed such that in response to the control signal C0 from the control unit 210, the maximum output level as its clamp voltage is adjusted and controlled. The output level limit value of the first clamp amplifier 10 is adjusted in accordance with the gain or the like of the PMT 72.

The LPF set 12 is a set or a group including a plurality (N-number) of LPF (low-pass filters) #1 to #N having respectively different frequency pass bands. Switches (11 and 13) located before and after the LPF set 12 are switching-controlled by the control signals C1 and C3 from the control unit 210. Thus, the LPF to be used is selected. The plurality of the LPFs are designed to have filters which, in association with the sample 110, the electron optical conditions of the beam scanning control, the scanning speeds, the sampling frequency of the ADC 52 and the like, allow a plurality of the respective bands to pass in accordance with the values thereof, so as to desirably allow the frequency band of analog signals to pass therethrough.

The variable gain amplifier 14 can variably control the gain of the amplitude of the signal after passing through the LPF (12) by the use of the control signal C4 from the control unit 210. The variable gain amplifier 14 can adjust the amplitude of a pulse signal forming a detection signal, with its amplifying level by the variable gain being adjusted in accordance with the sampling frequency of the ADC 52 or the like.

The second clamp amplifier circuit 15 is designed as such an output clamp amplifier that in response to the control signal C5 from the control unit 210, its maximum output level is adjusted and controlled. The maximum output signal level of the second clamp amplifier 15 is controlled in accordance with the maximum input signal range or the like of the AD converter 21 of the ADC 52. By the output level control by the first and second clamp amplifiers (10, 15), the maximum amplitude of the pulse signal serving as the detection signal is also controlled.

[Outline of Control of Secondary Electron Signal Detection System]

The following description will explain respective functions for controlling the respective units of the analog signal processing and amplifying unit 51 in the above-mentioned secondary electron signal detection system. The respective functions of the following (0) to (3) are controlled in cooperation with the other functions. In other words, the parameter values of the respective units are set in cooperation with one another.

(0) First, as the premise and prior art technique, a function for automatically adjusting the gain or the like of the PMT 72 of the detector 107 from the control unit 210 is provided. Moreover, a function for adjusting the maximum input range, the sampling frequency, the period or the like of the ADC 52 from the control unit 210 is provided. In particular, as the ABCC function, a function for adjusting the brightness and the contrast of an image to be obtained, by automatically adjusting the gain of the PMT 72 and the circuit offset or the like of the analog signal processing and amplifying unit 51, etc., is provided. In particular, as one of preliminary settings, the gain of the PMT 72 is corrected or calibrated by using the above-mentioned function of the automatic adjustments, and the corresponding data and setting information are preliminarily stored.

Moreover, in accordance with an instruction given by the user through the GUI unit 215, the control unit 210 controls the scanning speed in the scanning mode to be used in measurements and inspections. The user selects a scanning speed from, for example, 1-fold/, 2-fold/, 4-fold/, 8-fold scanning speeds and the like. The control unit 210 controls the scanning process of an electron beam and the sampling process of the ADC 52 by the scanning control unit 230 in accordance with the scanning speed of the selected scanning mode.

(1) The present measurement and inspection device is provided with a band switching function (in other words, a band switching unit) for switching the band of the analog signal processing in the analog signal processing and amplifying unit (AA) 51 in the secondary electron signal detection unit 50. By using a control signal (C1, C3) to a switch (11, 13) of the LPF set 12 from the control unit 210, an LPF to be used of the LPD set 12, that is, a band to be used, is selected in accordance with the scanning speed, the gain of the PMT 72, the sampling frequency and the input range of the ADC 52, and the like. The band to be selected is determined by the variable gain described in the following (2) and the clamp output described in the following (3). Thus, by providing a band suitable for the scanning speed or the like, the SNR is improved and the failure in taking a pulse signal in sampling, or the like, can be prevented.

In order to prevent ringing, delay in response or the like of the detection analog signal of secondary electrons (SE) from occurring and also to reduce excessive noise out of the band to the maximum level, this band switching function realizes a switching control to a desirable band in accordance with the scanning speed.

(2) The present measurement and inspection device is provided with a variable gain adjusting function (in other words, an amplifying level adjusting function, or a variable gain adjusting unit) for adjusting an amplifying level by the use of a variable gain of the analog signal processing and amplifying unit (AA) 51. By using a control signal C4 to the variable gain amplifier 14 from the control unit 210, the amplifying level by the corresponding variable gain is adjusted, in a manner so as to correspond to the scanning speed, the gain of the PMT 72, the sampling frequency and the input range or the like of the ADC 52, and also to be associated with the band of the above-mentioned (1), the clamp output or the like of the following (3). Thus, the size of the amplitude of a pulse signal to form a detection signal can be adjusted and the circuit saturation phenomenon or the like in the AA51 can be prevented.

(3) The present measurement and inspection device is provided with a clamp output adjusting function (in other words, an input/output level control function, or a clamp output adjusting unit) for limiting the maximum output level forming respective clamp voltages of the first and second clamp amplifier circuits (10, 15) forming the input/output portions of the analog signal processing and amplifying unit (AA) 51. By using control signals (C0, C5) given to the first and second clamp amplifier circuits (10, 15) from the control unit 210, the respective clamp outputs are adjusted in a manner so as to correspond to the scanning speed, the gain of the PMT 72, the sampling frequency and the input range or the like of the ADC 52, and also to be associated with the band of the above-mentioned (1) and the variable gain or the like of the above-mentioned (2). The respective maximum output levels of the first and second clamp amplifiers (10, 15) are controlled by the associated relationships. Thus, the circuit saturation phenomenon or the like in the AA 51 can be prevented.

[Example of Control and Settings]

Figure 7:
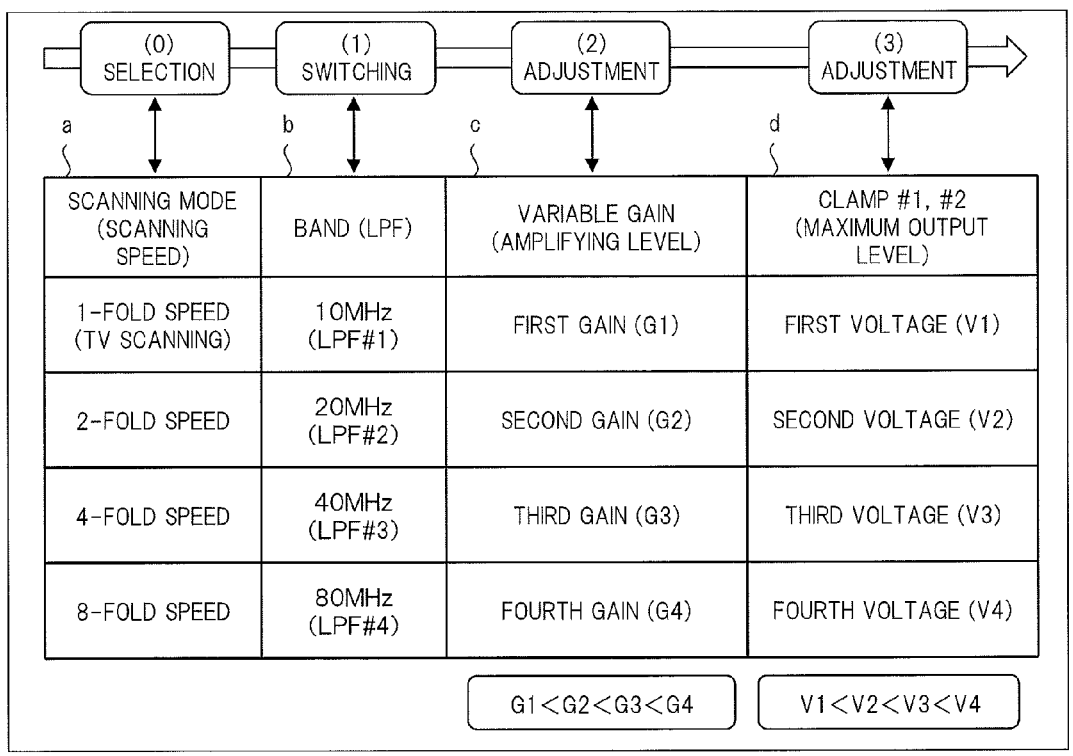
FIG. 7 is a diagram illustrating an example of correlated control processes of the secondary electron detection system of the measurement and inspection device of the first embodiment.

FIG. 7 shows an example of a correlated control and setting information of the respective functions for controlling the above-mentioned secondary electron signal detection system. The control unit 210 stores and manages table information as shown in FIG. 7. Moreover, it displays such table information on a setting screen by the GUI unit 215, that is, a GUI screen, for example, as shown in FIG. 8 to be described later, and allows the user to set various values. Additionally, the following description will explain a case in which the user is allowed to directly set parameter values in detail; however, the respective parameter values may be automatically set by the control unit 210 in accordance with a scanning mode or the like selected by the user.

In a table shown in FIG. 7, managing items, such as (a) scanning mode (scanning speed), (b) band (LPF), (c) variable gain (amplifying level) and (d) clamps #1 and #2 (maximum output level), are prepared.

First, in the item (a), the user selects and specifies a scanning mode (corresponding to scanning speed). For example, the user selects a scanning speed from, for example, 1-fold/ 2-fold/4-fold/8-fold speed. For example, in the case when a normal TV scanning operation, which is a low-speed scanning operation, is carried out, the user selects the 1-fold scanning speed.

Next, in the item (b), a suitable band in accordance with the scanning speed selected in the item (a) is selected as a suitable LPF. For example, in the case of the 1-fold speed (TV scanning), a band required for allowing a detection analog signal or pulse signal of secondary electrons (ES) to pass therethrough is 10 MHz, and the LPF #1 having a pass band corresponding to this is selected. In the same manner, in the case of the 2-fold speed, the LPF #2 having 20 MHz is selected, in the case of the 4-fold speed, the LPF #3 having 40 MHz is selected, and in the case of the 8-fold speed, the LPF #4 having 80 MHz is selected respectively. In response to the selection in the item (b), the LPFs of the LPF set 12 are switched and controlled. By using the present setting, the SNR can be improved.

Next, in the item (c), in response to the selections in the steps (a) and (b), an amplifying level is set by a variable gain. For example, in the case of 10 MHz at 1-fold speed, a suitable first gain (G1) is set. In the same manner, the gains (G2 to G4) are respectively set. In this case, G1<G2<G3<G4 is satisfied. In accordance with the settings of the process (c), the values of the variable gain of the variable gain amplifier 14 are controlled as described above.

Next, in the item (d), in accordance with the selections and setting values of the items (a), (b) and (c), the limit values of the maximum output level of the respective clamps #1 (10) and #2 (15) are set. For example, in the case of, for example, 10 MHz at 1-fold speed with the first gain (G1), a suitable first voltage (V1) is set. In the same manner, the respective clamp voltages (V2 to V4) are set in the same manner. In this case, V1<V2<V3<V4 is satisfied. In accordance with the settings of the item (d), the clamp voltage values of the respective clamp amplifiers (10, 15) are controlled as described above.

Additionally, as shown in the table or screen of FIG. 7, correlated patterns of the respective parameters in accordance with the scanning speeds or the scanning modes are preliminarily prepared, and the user may select them to be used.

[GUI Screen]

FIG. 8 shows examples of screens for use in setting and controlling the respective parameter values of the secondary electron signal detection system upon carrying out measurements/inspections, as display examples of the GUI screen by the GUI unit 215. In particular, in the present embodiment, screen examples are shown in association with the ABCC function that is the prior art technique as described earlier. As the ABCC function, a function for automatically adjusting the brightness, contrast or the like of a measuring image or an inspecting image is prepared, and setting items corresponding to this function are included. Moreover, in the same manner as in FIG. 7, the screen in this case allows the user to directly set respective parameter values in detail.

FIG. 8(a) shows an image of the GUI screen for use in carrying out settings and controls corresponding to the ABCC function in the measuring device or the measuring function of the prior art. The present screen includes an item g0 for basic settings, an item g1 for adjusting an image contrast in accordance with the ABCC function, an item g2 for adjusting the brightness of an image and an item g3 relating to the results of ABCC adjustments, or the like.

Item g0 for the basic settings is an item for displaying parameter information, such as basic measuring conditions to thereby allow the user to form user settings. Although detailed illustrations are omitted from the FIG., item g0 for the basic settings includes an item for displaying and setting information of the sample 110 forming a target for measurements or inspections, an item for displaying and setting electron optical conditions and recipe (set of conditions and parameters) upon measuring or inspecting, an item for setting a scanning speed or a scanning mode, an item for setting the aforementioned frame integrating number of times, and an item for setting the magnification of the measuring/inspecting output, or the like. For example, in a detailed screen for allowing the user to select a desired item and for proceeding to the next screen, corresponding parameter values can be confirmed and set. The user can make a selection, for example, among 1-fold/2-fold/4-fold and 8-fold speeds as a scanning mode.

Item g1 for the image contrast adjustment is capable of adjusting the gain value of the PMT 502, and in association with this set value, the image contrast is adjusted by the aforementioned control signal Ca. Parameter values can be adjusted and set by slide bars or the like within the screen through the user's operation.

Item g2 for the image brightness adjustment is capable of adjusting the circuit offset value of the secondary electron signal detection circuit 50, and in association with this set value, the image brightness is adjusted. More specifically, based upon histograms of an image acquired in each of measurements, the gain of the PMT 502 and the circuit offset value are automatically adjusted by the ABCC function.

Item g3 relating to the results of ABCC adjustments is capable of displaying a graph and data information or the like of the adjustment results obtained by the ABCC function using the above-mentioned items g1 and g2.

In the prior art, the contrast and brightness of an image can be adjusted by the ABCC function or the like as described above; however, since only the gain or the like of the PMT 502 can be adjusted, adjustments are not desirably converged in some cases. In particular, depending on the material for the sample, pattern and set values for the gain of the PMT 502, there is a possibility of occurrence of a circuit saturation phenomenon, or the like, in the analog signal processing and amplifying unit 504.

On the other hand, FIG. 8(b) shows an image of the GUI screen for use in carrying out settings and controls corresponding to the ABCC function in the measurement and inspection device of the present invention. In addition to item g0 for basic settings and the respective items (g1, g2, g3) for the ABCC function that are the same as those of the prior art of FIG. 8(a), respective items (g11, g12, g13), which are capable of setting the respective functions for suitably adjusting the respective units of the circuits of the secondary electron signal detection system, in particular, the respective units of the analog signal processing and amplifying unit 51, are installed. That is, in the present screen, item g11 for a circuit band switching (LPF selection) function, item g12 for a variable gain amplifier adjusting function (signal amplifying level adjustment) and item g13 for a clamp voltage adjusting function (maximum output level control) are prepared.

Item g11 for a circuit band switching (LPF selection) function is capable of setting the circuit frequency band of the analog signal processing and amplifying unit (AA) 51 or the LPF for use in association with the band. In item g11, the user is allowed to switch or adjust the corresponding band or LPF by using a bar, a numeric value input column, or an LPF selection button, etc. A desired LPF (#1 to #N) to be used may be directly selected.

In item g12 for the variable gain amplifier adjusting function (signal amplifying level adjustment), the amplifying level by a variable gain of the variable gain amplifier 14 can be set in accordance with the scanning speed and band to be used. Item g12 allows the user to adjust the corresponding variable gain value by using a slide bar, a numeric value input column or the like.

Item g13 for the clamp voltage adjusting function (maximum output level control) is capable of setting the maximum input level limit value of the first clamp amplifier 10 and the maximum output level limit value of the second clamp amplifier 15 in accordance with the scanning speed, the band to be used and the variable gain. In item g13, the user is allowed to adjust the corresponding maximum output level limit value by using a slide bar, a numeric value input column or the like.

By using the settings on the above-mentioned screen, it is possible to effectively adjust measuring and inspecting functions including the ABCC function. In other words, with respect to any of the scanning speeds, such as a high-speed scanning and a low-speed scanning by the user's selection, the corresponding operation is suitably carried out so as to set the circuit band, the sampling operation or the like of the secondary electron signal detection system to an appropriate state. Thus, the aforementioned SNR reduction, prevention of a failure in taking a pulse signal and prevention of circuit saturation phenomenon, or the like can be realized, and the high-speed measuring and inspecting operations with high precision can be achieved.

The following description will explain an example of the order of settings of the respective items on the present GUI screen by the user. That is, (0) setting of the scanning speed or the like in item g0, (1) setting the band or LPF in item g11, (2)

setting of the amplifying level by the variable gain in item g12, (3) setting of the clamp output in item g13 and (4) setting and confirmation of the image contrast and brightness in respective items g1 to g3 of the ABCC function.

(0) The user selects a desired scanning speed at item g0. (1) The user selects the band or the LPF in association with the selected scanning speed at item g11. For example, in the case of 1-fold scanning speed (TV scanning), the frequency is set to 10 MHz. (2) At item g12, in accordance with the set value of the band, the value of the amplifying level by the variable gain is set by using the aforementioned preliminarily executed gain correction or calibration data. Additionally, in the case when the calibration data are not used, the variable gain value to be used may be desirably set by the user. (3) At item g13, in accordance with the set values of the band and variable gain, the maximum input level limit value of each of the clamps is set. In this case, for example, in accordance with the maximum amplitude value (for example, c1 of Sc of FIG. 11) of the analog signal amplified by the preamplifier circuit 30 that is estimated by the control unit 210 or the like by using, for example, setting values of the band and the variable gain, the corresponding limit value is set by using the set values of the band and variable gain. (4) Next, by utilizing the aforementioned items g1 and g2, the user carries out the ABCC adjustments, or the adjustments of the image contrast and brightness, while confirming the histograms of the acquired image displayed as item g3. In this case, if the focusing property is poor in the ABCC adjustment results (g3) due to circuit saturation or the like, the user again carries out the ABCC adjustments in the same manner, while finely adjusting, for example, the above-mentioned respective items (g11 to g13), that is, the maximum output level limit value or the like of the clamps. Thus, it becomes possible to obtain a superior image.

[Measurement and Inspection Method]

The following description will schematically shows a measuring/inspecting method and user's operations by using the present measurement and inspection device.

(Step S1) In the aforementioned GUI screen or the like, the user selects a measuring function or an inspecting function by the aforementioned GUI screen or the like, and sets parameter values for the sample 110, the electron optical conditions, the scanning mode in association with the scanning speed, the number of frame integration operations, the magnification or the like, as basic conditions for the measuring/inspecting operation. Alternatively, information that has been set may be read out and used.

(S2) In the aforementioned GUI screen (see FIG. 8(b)), the user sets parameter values of the respective units (10 to 15) of the secondary electron signal detection system. Alternatively, as shown in a table in FIG. 7, information that has been set may be read out and used.

(S3) The user instructs a start of a measuring/inspecting process and inputs the corresponding command to the measurement and inspection device. In accordance with the settings including the aforementioned selected scanning speed, the measurement and inspection device executes controls of the measuring and inspecting process including the scanning control. That is, as described earlier, the respective units inside the column 100 are controlled from the computer 200 so that a signal derived from secondary electrons (SE) is detected by the detector 107. Then, from the detector 107 (71 and 72), the detection signal of secondary electrons (SE) is acquired as sampling data, through processes in the analog signal processing and amplifying unit 51 of the secondary electron signal detection unit 50 and the ADC 52 by way of the preamplifier 30.

(S4) The image processing unit 205 carries out an image processing operation on sampling data from the ADC 52, and generates a two-dimensional measurement image or inspection image. Moreover, in the case when a statistical process, such as frame integration operations or the like, is carried out, the above-mentioned operations are carried out in the same manner a plurality of times on each of the images.

(S5) The control unit 210 acquires the measurement image or inspection image, and carries out a measuring process for a circuit pattern dimensional value and a detecting process, such as an abnormal detection determination or the like, and stores data information including the measured results and images in a memory or the like. Then, by using the GUI unit 215, GUI screen data for use in displaying data information including the corresponding image are generated and displayed on a display.

(S6) The user confirms the results of the measured image or inspected image by viewing the above-mentioned GUI screen. Moreover, by returning to step S1 or the like, if necessary, the same processes are again carried out in the same manner, with the setting values being altered, so that a measured image or an inspected image is obtained based upon different set values.

[Signal Waveform of Prior Art]

Figure 9:
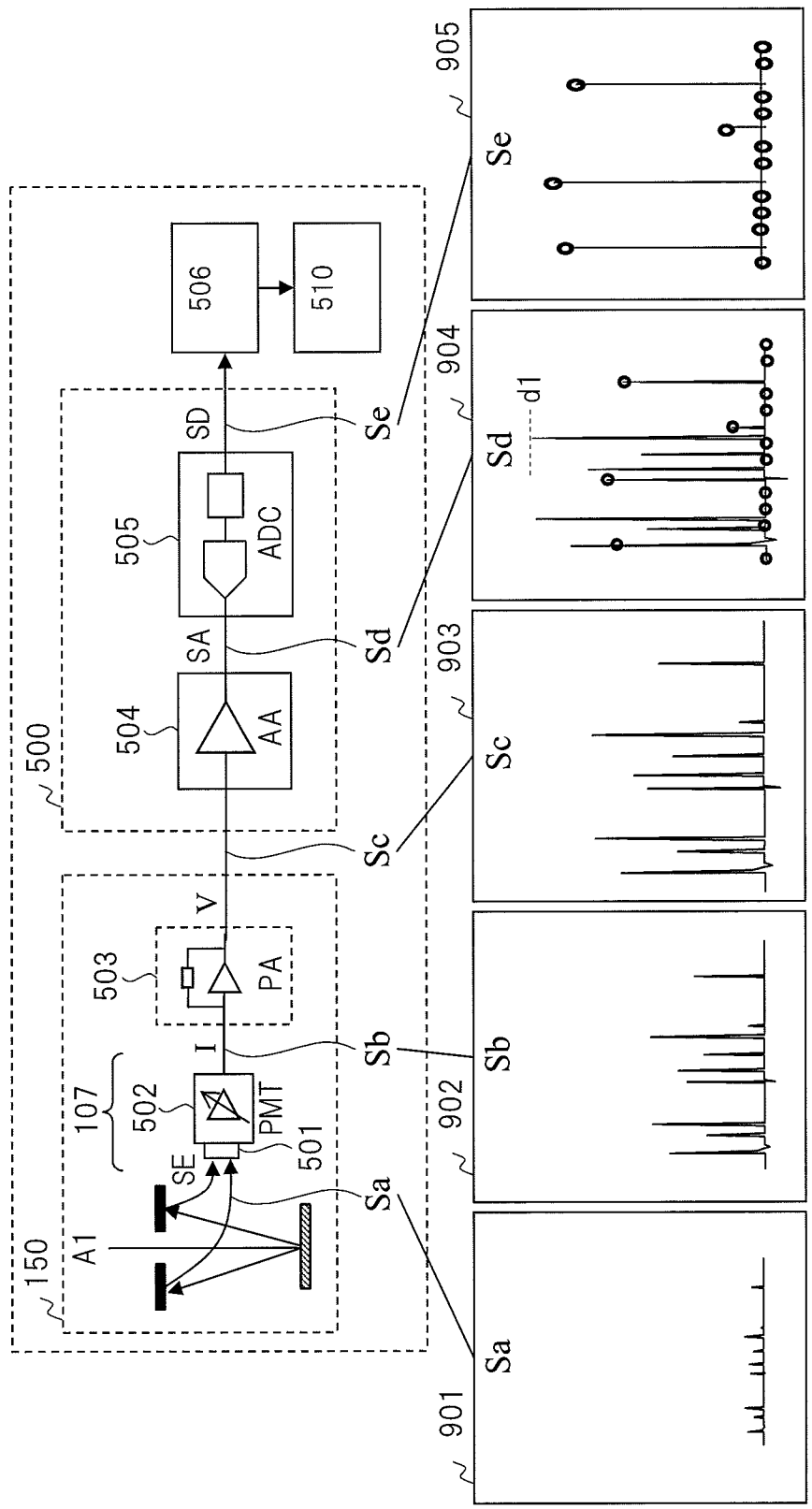
FIG. 9 is a diagram illustrating respective signal waveforms of the secondary electron detection system according to the prior art.

FIG. 9 shows an image of each of signal waveforms in the secondary electron signal detection system (FIG. 4) of the prior art for use in comparison. On the upper side in the FIG., a structural example of the secondary electron signal detection system is shown in the manner as in FIG. 4. Reference numeral Sa (901) represents a signal of secondary electrons (SE) that is made incident on the detector 107. Sb (902) represents a current signal waveform of an output of the PMT 502. Sc (903) represents a voltage signal waveform of an output of the preamplifier 503. Sd (904) represents a detected analog signal waveform of secondary electrons (SE) amplified and serving as an output of the analog signal processing and amplifying unit 504. A circle mark (o) indicates a sampling point in the ADC 505. Se (905) represents a digital signal waveform of an output of the ADC 505. The sampling results of the output of the ADC 505 are acquired as a two-dimensional image in accordance with the sample pattern, after passing through an image processing and a frame integration operation or the like in the image processing unit 506.

Waveform Sa includes a pulse signal having a small amplitude. As shown by Sb, Sc and Sd, the detection signal of secondary electrons (SE) has a waveform including a discrete pulse signal having a frequency distribution in accordance with a pattern or the like of the sample. Most of these plural pulse signals have a short width and interval. In a flat portion of the pattern, the frequency of appearance of pulse signals is low, while in an edge portion of the pattern, the frequency of appearance of pulse signals is high with a large amplitude.

In the prior art example, at the time of a low-speed scanning operation, as indicated by Sd (904), the analog signal of secondary electrons (SE) tends to cause a reduction in the SNR due to an insufficient band. Moreover, a pulse signal with a large amplitude (for example, dl of Sd) tends to cause a failure in being properly sampled in the ADC 505 due to a circuit saturation phenomenon occurring in the analog signal processing and amplifying unit 504. Furthermore, in the case when the sampling frequency of the ADC 505 is larger than the interval or width of pulse signals, a failure in taking a pulse signal tends to occur at the time of sampling as indicated by Sd and Se.

Figure 10:
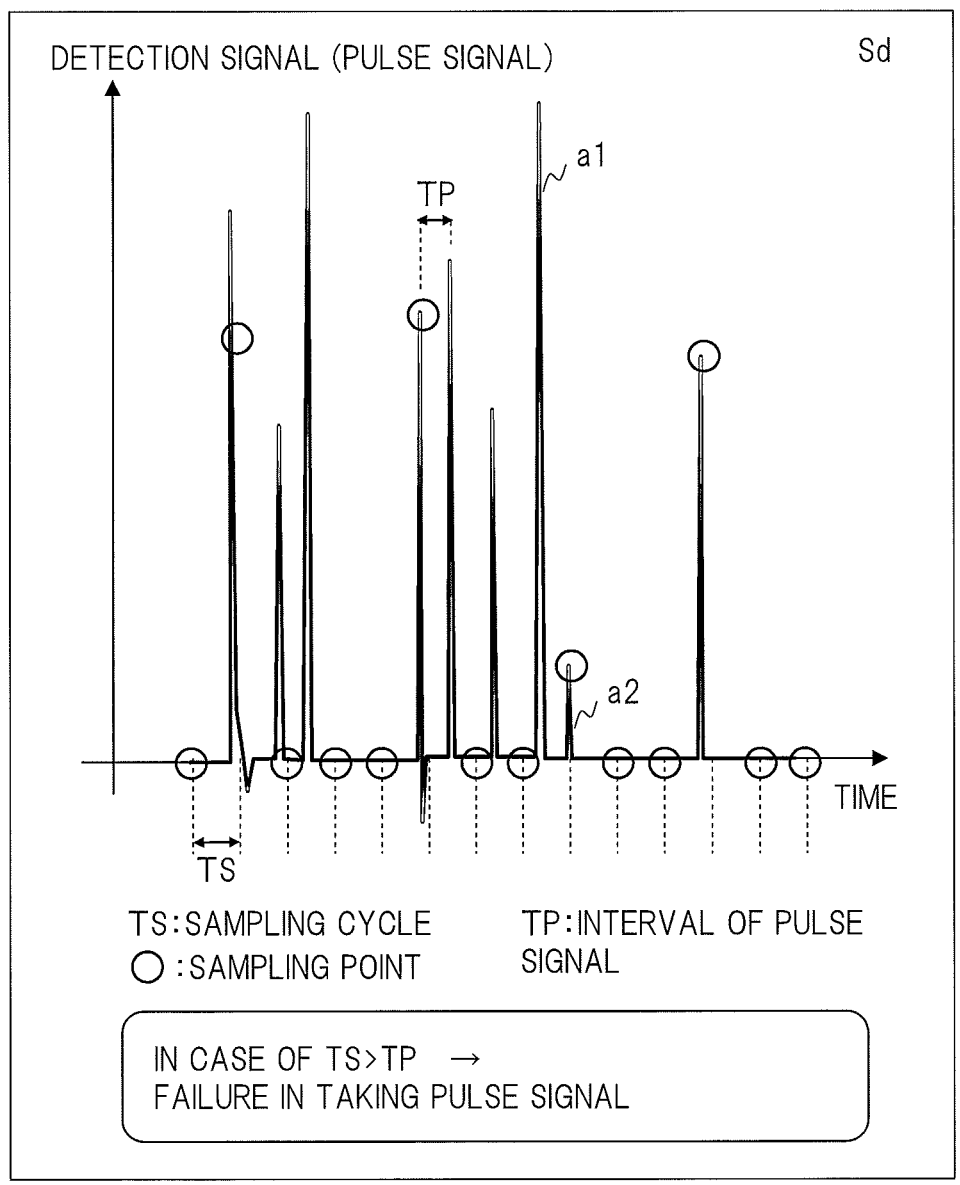
FIG. 10 is a diagram illustrating an example of a signal waveform of the secondary electron detections system according to the prior art.

FIG. 10 shows a pulse signal serving as a detection signal for secondary electrons (SE) in accordance with Sd (904) of FIG. 9 in an enlarged manner as one of the problems in the prior art. In particular, a waveform including a portion caused in the case when the interval (TP) of the pulse signals is smaller than the sampling cycle (TS) of the ADC 505 (TS>TP) is shown. The sampling cycle is represented by TS, and the interval of pulse signals is represented by TP. A circle mark (o) indicates a sampling point.

In the case of TS≤TP and at the corresponding portion, pulse signals can be sampled without causing any problems. In a detection system corresponding to the TV scanning of the prior art, the frequency band of the entire circuit including the analog signal processing and amplifying unit 504 only has, for example, a maximum of 10 MHz corresponding to 10 Msps that is the sampling cycle at the time of TV scanning. Moreover, the width or interval (TP) of the pulse signal forming the detection signal is, for example, greater than 100 ns or more serving as the sampling cycle (TS) (TS≤TP). Therefore, it is possible to carry out a sampling process without causing a failure in taking a pulse signal.

However, in the case of TS>TP and at the corresponding portion as shown in FIG. 10, it is not possible to appropriately sample all the appearing pulse signals, and there is a phenomenon of a failure in taking a pulse signal. Since along with high-speed scanning process and wide bandwidth of the circuit including the analog signal processing and amplifying unit 504, the detection signal, such as Sb and Sc in FIG. 9, also has a high speed, that is, a shortened pulse interval or width, with the result that a large amplitude is formed. For example, in the case of a circuit in which the bandwidth is widened so as to allow an 8-fold scanning speed, the width or the interval (TP) of the pulse signal becomes 12.5 ns at the shortest. In the case when a low-speed scanning process is carried out by using a circuit configuration having a widened bandwidth for the high-speed scanning process, there is a possibility of a width or interval (TP) of the shortest pulse signals becomes shorter than the sampling cycle (TS) (TS>TP). For example, the sampling cycle (TS) becomes 100 ns, thereby causing TS>TP. Thus, as shown in an example of FIG. 10, the phenomenon of a failure in taking a pulse signal in sampling occurs. Moreover, the occurrence of a circuit saturation phenomenon in the analog signal processing and amplifying unit 504 and the occurrence of a ringing in waveform, a delay in response or the like are caused, with the result that the circuit operation becomes unstable, and undesired influences are given to the precision of measuring or inspecting process. Consequently, since defective information is caused in the resulting image to be acquired, the precision of the measuring or inspecting process deteriorates.

Therefore, the present embodiment provides a configuration having a scanning control function capable of handling both of the high-speed scanning and low-speed scanning processes, and also a configuration capable of desirably controlling respective units of the analog signal processing and amplifying unit 51 as described earlier in accordance with a scanning speed. Thus, it becomes possible to solve the above-mentioned problems and consequently to realize a high-speed measuring/inspecting process with high precision.

[Signal Waveform of Present Embodiment]

Figure 11:
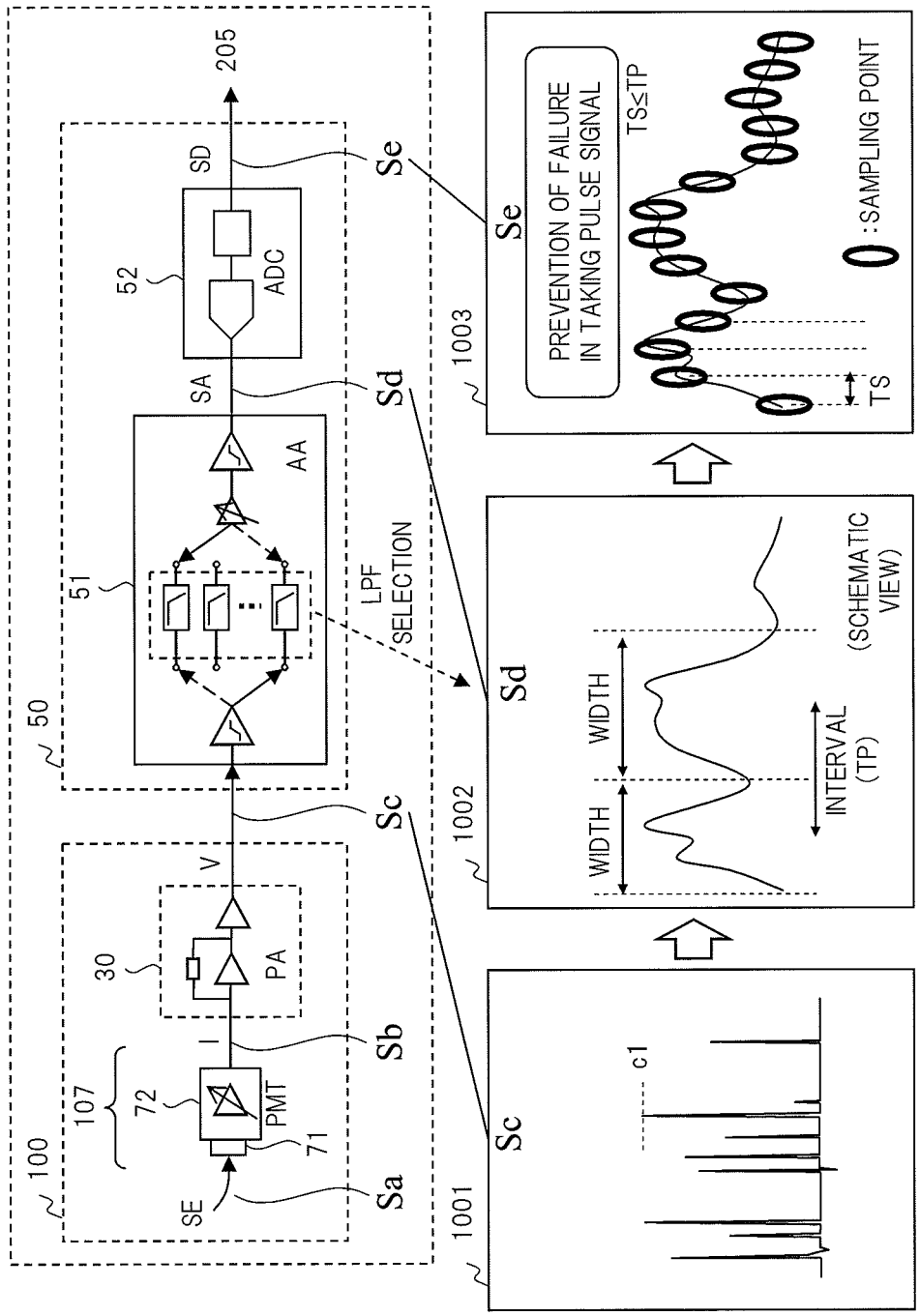
FIG. 11 is a first explanatory view illustrating one of effects of the first embodiment.

FIG. 11 shows respective signal waveforms in the secondary electron signal detection system as images illustrating the effects of the first embodiment. Reference numerals Sa to Se represent signal waveforms of the present embodiment that correspond to the respective signal waveforms of the prior art in FIG. 9. In the present embodiment, by utilizing the aforementioned band switching function, variable gain adjusting function and clamp output adjusting function or the like, the respective signal waveforms are adjusted so as to be suitable shapes. With respect to a fast pulse signal, that is, a waveform having a narrow pulse width and interval, as shown by a waveform Sc (1001), by carrying out an analog processing and an amplifying processing within a suitable band in the analog signal processing and amplifying unit 51, a pulse signal having a slow change in terms of time, as shown by a waveform Sd (1002), that is, a waveform having a wide pulse width and interval, is formed. Additionally, in Sd (1002), a schematic interval between two pulses is indicated as TP. By using the adjusted waveform Sd as the input of the ADC 52, a sampling process is carried out so that as shown by a waveform Se (1003), an appropriate sampling process can be carried out. That is, even in the case when the corresponding waveform Sd is sampled by using a slow sampling cycle (TS) corresponding to the low-speed sampling, since TS≤TP is satisfied, no failure in taking a pulse signal is generated. In other words, the sampling precision is enhanced and the quality of the measuring image/inspecting image can be improved.

Figure 12:
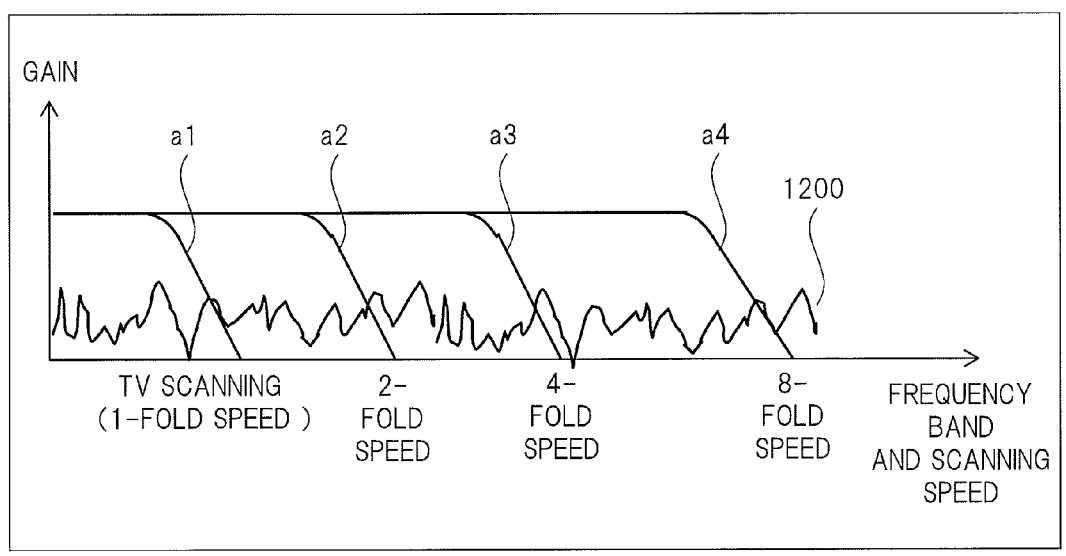
FIG. 12 is a second explanatory view illustrating another effect of the first embodiment.

Moreover, FIG. 12 indicates the fact that by properly selecting the gain and the band of the analog signal processing and amplifying unit 51 in accordance with the respective scanning speeds, the corresponding amounts of noise become different, as images illustrating the effects of the first embodiment. Reference numeral 1200 shows a noise signal. As the scanning speed and bands, a band (a1) of a TV scanning speed, that is, 1-fold scanning speed, a band (a2) of 2-fold scanning speed, a band (a3) of 4-fold scanning speed, and a band (a4) of 8-fold scanning speed are shown. In the aforementioned band switching function, for example, in the case of a1, LPF#1 of the LPF set 12 is selected, in the case of a2, LPF#2 is selected, in the case of a3, LPF#3 is selected, and in the case of a4, LPF#4 is selected. Thus, by selecting the narrow signal band, such as a1, at the time of, for example, a low-speed scanning process, it is understood that the corresponding amount of noise can be reduced. That is, the reduction of SNR can be prevented so that it becomes possible to achieve a measuring/inspecting process with high precision.

Second Embodiment

Figure 13:
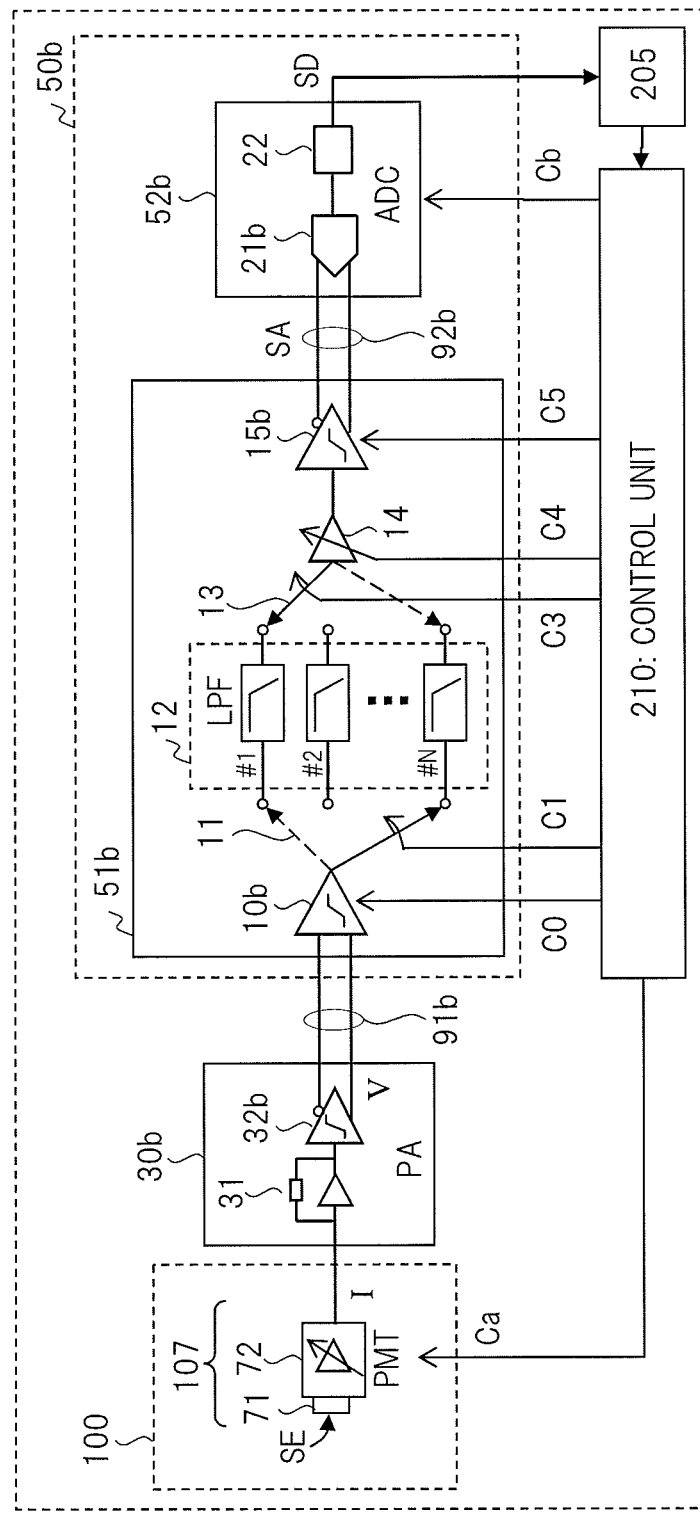
FIG. 13 is a diagram illustrating a configuration of a secondary electron signal detection system according to a second embodiment of the present invention.

Referring to FIG. 13, the following description will explain a measurement and inspection device of a scanning-type electron beam system according to a second embodiment of the present invention. The basic configuration of the second embodiment is the same as that of the first embodiment (FIG. 1 or the like), and the configuration is provided with a differential transmission means as a configuration different from that of the first embodiment.

FIG. 13 shows a configuration of a secondary electron signal detection system of the measurement and inspection device of the second embodiment. Main portions that are different from those of the aforementioned embodiment (FIG. 5) include a first differential cable 91b and a second differential cable 92b for use in connecting the respective units, and also include as differential configurations corresponding thereto a differential output preamplifier circuit 30b, and a secondary electron signal detection unit 50b (51b and 52b) corresponding to the differential input/output. The differential output amplifier circuit 30b includes a differential output-type amplifier 32b. The secondary electron signal detection unit 50b has a differential input/output-type analog signal processing and amplifying unit 51b and a differential ADC 52b corresponding to a differential input. The analog processing and amplifying unit 51b is provided with a first differential clamp amplifier circuit 10b and a second differential clamp amplifier circuit 15b. The differential ADC 52b is provided with an AD converter 21b of a differential input type.

The differential output preamplifier 30b coverts an output current (I) from the detector 107 (71, 72) to a voltage (V), and the resulting voltage is pre-amplified by the differential output-type amplifier 32b so that a differential signal is outputted. A differential output signal from the differential output preamplifier circuit 30b is differentially inputted to the first differential clamp amplifier circuit 10b by way of the first differential cable 91b. The first differential clamp amplifier circuit 10b is a differential input/single output clamp amplifier circuit, which has its maximum output level controlled in the same manner as described earlier. Moreover, the second differential clamp amplifier circuit 15b is a single input/differential output clamp amplifier circuit, which has its maximum output level controlled in the same manner in accordance with the maximum input range of the ADC 52b, as described earlier. The differential output analog signal, which has been subjected to an analog processing and amplified, and sent from the second differential clamp amplifier circuit 15b, is inputted to the AD converter 21b of the differential input-type ADC 52b by way of the second differential cable 92b, and processed in the same manner as described earlier, so that a digital signal (SD) is outputted.

In the same manner as in the aforementioned embodiment, the control unit 210 controls parameter values of the respective units by respective control signals (C0 to C5, etc.). For example, by the control signals C0 and 05, the maximum output level of each of the clamps (10b 15b) is limited in accordance with the aforementioned variable gain or the like so that the circuit saturation phenomenon of the analog signal processing and amplifying unit 51b can be prevented.

In the second embodiment, by providing a configuration in which among all the elements (30b, 51b and 52b) forming the secondary electron signal detection system, all the differential signals are transmitted by using differential cables 91b and 92b, noise resistance or external disturbance resistance is strengthened in the circuits of the detection system in addition to the effects of the first embodiment, so that radiation noise or the like can be suppressed, and noise superimposed on an acquired image can be reduced; thus, it becomes possible to improve the precision of measurements and inspections.

Moreover, in the configuration (FIG. 1) of the aforementioned first embodiment, in the case when a configuration according to the prior art is used, in the vicinity of a side face, for example, in the inside, of the column 100 serving as a casing, an electron circuit substrate or the like on which a preamplifier circuit 30 or the like connected to the detector 107 (71, 72) is mounted is installed. Since the substrate on which the preamplifier circuit 30, or circuits positioned on the succeeding stage thereof are further mounted together therewith is positionally located close to the detection system such as the detector 107 or the like inside the column 100, the substrate tends to give adverse effects thereto. Therefore, as shown in the second embodiment, a configuration in which a differential signal is transmitted by using the differential cables 91b and 92b is prepared, and the substrate of the preamplifier 30 is disposed on the outside or the like of the side face of the column 100, with the secondary electron signal detection unit 50b or the like being disposed at a position spaced apart from the column 100. Thus, it becomes possible to reduce influences given from the preamplifier circuit 30 or the like to the detection system inside the column 100. By using long differential cables 91b and 92b, the respective elements (30b, 51b, 52b) are disposed spaced apart from one another so that mutual influences can be reduced.

Additionally, not limited by the mode in which the two differential cables (91b, 92b) are used for connection, only one of them has a differential transmitting mode may be adopted.

<Effects, Etc.>

As described above, in accordance with the measurement and inspection device of the present embodiment, a controlling function for suitably handling various scanning speeds including a high scanning speed and a low scanning speed is provided, and a high-speed measuring/inspecting process with high precision can be realized, even in the case when the secondary electron signal detection system is allowed to have a wide bandwidth so as to achieve a high-speed scanning process. In particular, by providing a configuration for desirably controlling the band/amplifying level and clamp output, or the like, by controlling the respective units inside the secondary electron signal detection unit 50, it is possible to reduce or improve the SNR by the reduction of noise signal, to prevent a failure in taking a pulse signal at the time of sampling and also to prevent the circuit saturation phenomenon.

The present measurement and inspection device is provided with a control function for a plurality of scanning speeds including, for example, a high-speed scanning related to control of the amount of electrostatic charge of the aforementioned sample, a high-speed secondary electron signal detection system corresponding to the function, and a GUI screen or the like capable of carrying out various settings. In addition to this, even at the time of a low-speed scanning process, it is possible to achieve a good measuring/inspecting process without causing the above-mentioned SNR reduction, failure in taking a pulse signal and circuit saturation.

As described above, the invention by the inventors has been specifically explained according to the embodiments; however, it is obvious that the invention is not limited to the embodiments and various changes may be made without departing from the scope of the invention.

Not limited to, for example, a mode provided with all the aforementioned three functions, that is, (1) band switching function, (2) variable gain adjusting function and (3) clamp output adjusting function, a mode provided with one or two of them may be used. For example, a mode provided with only the band switching function, or a mode provided with the two functions, that is, the band switching function and the variable gain adjusting function, may be provided.

Moreover, although the LPF set 12 is used for the band switching control, not limited to the LPF, various kinds of filters and a combination thereof may be used for the control.

EXPLANATION OF REFERENCE NUMERALS

10 . . . first clamp amplifier circuit, 11 . . . first switch, 12 . . . LPF set, 13 . . . second switch, 14 . . . variable gain amplifier circuit (variable gain amplifier), 15 . . . second clamp amplifier circuit, 21 . . . AD converter, 22 . . . digital signal processing circuit, 30 . . . preamplifier (preamplifier circuit), 31 . . . I-V conversion circuit, 32 . . . amplifier, 50 . . . secondary electron signal detection unit, 51 . . . analog signal processing and amplifying unit, 52 . . . analog/digital conversion unit (ADC), 71 . . . fluorescent substance, 72 . . . PMT, 91, 92 . . . cable, 100 . . . column, 107 . . . detector, 110 . . . sample, 119 . . . reflection plate, 200 . . . computer, 205 . . . image processing unit, 210 . . . control unit, 215 . . . GUI unit, 220 . . . electron optical control unit, 230 . . . scanning control unit, 231 . . . deflection control unit, 240 . . . detection control unit, 241 . . . objective lens control unit, 250 . . . mechanical system control unit.

The invention claimed is:

1. A measurement and inspection device which carries out at least either a measuring process or an inspecting process on a sample by using a scanning type electron beam system, comprising:
    an irradiation unit for irradiating the sample with an electron beam, while scanning and controlling the beam thereon;
    a detection unit for detecting secondary electrons generated from the sample as an electric signal;
    an analog signal processing and amplifying unit to which a detection signal of the detection unit is inputted to be subjected to an analog signal processing and amplified, and then outputted;
    an AD conversion unit to which the outputted analog signal of the analog signal processing and amplifying unit is inputted to be converted to a digital signal, and then outputted;
    a processing unit to which the outputted digital signal of the AD conversion unit is inputted to generate data information including an image for use in the measurements or the inspections and also to output the resulting data information; and
    a band switching unit for switching a frequency band of the analog signal to be passed through the analog signal processing and amplifying unit among a plurality of states in association with a scanning speed of the scanning control and a gain of the detection unit.

2. The measurement and inspection device according to claim 1, further comprising:
    a control unit for controlling the entire operations including the measurements or inspections and for storing and managing data information relating to the measurements or inspections;
    an interface unit for providing a user interface for use in work including the measurements or inspections; and
    a preamplifier for converting an output current signal from the detection unit to a voltage and for pre-amplifying the voltage to be outputted,
    wherein the irradiation unit further comprises:
    an electron optical system for irradiating an electron beam onto the sample;
    an electron optical control unit for controlling the electron optical system; and
    a scan controlling unit for carrying out a scan controlling process upon irradiating the electron beam onto the sample,
    the detection unit further comprises a detector for detecting secondary electrons generated from the sample upon irradiation of the sample with the electron beam as an electric current signal,
    the analog signal processing and amplifying unit receives input of the output voltage signal from the preamplifier, and carries out an analog signal processing on the signal and amplifies the signal to be outputted,
    the processing unit comprises an image processing unit that receives input of the output digital signal of the AD conversion unit, generates data information including an image for use in the measurements or the inspections, and outputs the data information to a user through the interface unit, and
    the band switching unit switches a frequency band of the analog signal to be passed through the analog signal processing and amplifying unit among a plurality of states in accordance with the scanning speed of the scanning control, the gain of the detector, and an input range of the AD conversion unit.

3. The measurement and inspection device according to claim 2, further comprising:
    a variable gain adjusting unit for adjusting an amplifying level by a variable gain amplifier of the analog signal processing and amplifying unit in association with the scanning speed of the scanning control, the gain of the detector, the frequency band, and the input range of the AD conversion unit.

4. The measurement and inspection device according to claim 3, further comprising:
    a clamp output adjusting unit for carrying out adjustments so as to limit a maximum output level of a clamp amplifier of the analog signal processing and amplifying unit in association with the scanning speed of the scanning control, the gain of the detector, the frequency band, an amplifying level by the variable gain amplifier and the input range of the AD conversion unit.

5. The measurement and inspection device according to claim 2,
    wherein the analog signal processing and amplifying unit comprises:
    a first clamp amplifier to which the output voltage signal of the preamplifier is inputted and from which the input signal is outputted within a maximum output level limit value which is set in accordance with the gain of the detector;
    a plurality of filters for allowing a plurality of frequency bands to be passed therethrough, to which the output analog signal of the first clamp amplifier is inputted to be switched so that a filter in accordance with the frequency band to be passed is selected in association with the scanning speed;
    a switch for use in selecting the filter;
    a variable gain amplifier to which the output of the filter is inputted and from which the inputted signal that is amplified by an amplifying level by a variable gain set in accordance with the gain of the detector and the frequency band of the filter is outputted; and
    a second clamp amplifier to which the output of the variable gain amplifier is inputted and from which the input variable gain amplifier is outputted within a maximum output level limit value which is set in accordance with the gain of the detector, the frequency band of the filter and the variable gain.

6. The measurement and inspection device according to claim 5,
    wherein the control unit is provided with:
    a function for switching the frequency band to be passed therethrough by selecting a filter from the plurality of filters based upon a control signal relative to the switch given from the analog signal processing and amplifying unit;
    a function for adjusting the amplifying level by the variable gain based upon a control signal relative to the variable gain amplifier of the analog signal processing and amplifying unit; and
    a function for adjusting a maximum output level of each of the first and second clamp amplifiers based upon a control signal relative to each of the first and second clamp amplifiers of the analog signal processing and amplifying unit.

7. The measurement and inspection device according to claim 2,
    wherein the interface unit generates a screen for displaying data information including an image for use in the measurements or the inspections, and outputs the screen to a user;

the control unit carries out controlling processes in accordance with the information set in response to operations of the user on the screen; and the screen is provided with an item for selecting the scanning speed in response to the operation of the user, and an item for switching the frequency band to be passed therethrough of the analog signal processing and amplifying unit in accordance with the scanning speed in response to the operation of the user.

8. The measurement and inspection device according to claim 7, wherein the screen is provided with an item for adjusting the amplifying level by the variable gain of the analog signal processing and amplifying unit in accordance with the scanning speed in response to the operation of the user.

9. The measurement and inspection device according to claim 8, wherein the screen is provided with an item for adjusting a maximum output level limit value of the clamp amplifier of the analog signal processing and amplifying unit in accordance with the scanning speed in response to the operation of the user.

10. The measurement and inspection device according to claim 2, wherein the interface unit is capable of selecting one of two or more scanning speeds in response to the operation of the user;

the scanning control unit carries out a scan controlling process upon irradiation of the sample with the electron beam at a scanning speed selected by the user; and the analog signal processing and amplifying unit comprises a plurality of filters for allowing frequency bands corresponding to respective two or more scanning speeds to pass therethrough, with the filter corresponding to the scanning speed selected by the user being selected.

11. The measurement and inspection device according to claim 4, wherein, in the case of a first scanning speed, the analog signal processing and amplifying unit is switched to a state having a first frequency band, a first variable gain and a first maximum output level, and in the case of a second scanning speed faster than the first scanning speed, the analog signal processing and amplifying unit is switched to a state having a second frequency band wider than the first frequency band, a second variable gain greater than the first variable gain and a second maximum output level that is greater than the first maximum output level.

12. The measurement and inspection device according to claim 2, wherein the interface unit generates a screen for displaying data information including an image for use in the measurements or the inspections and outputs the screen to a user;

the control unit carries out controlling processes in accordance with the information set in response to the operation of the user on the screen;

the screen is provided with an item for adjusting a brightness of the image in response to the operation of the user, an item for adjusting a contrast of the image in response to the operation of the user, and an item for displaying the results of adjustments of the brightness and the contrast on the image; and the control unit adjusts the brightness of the image by adjusting a circuit offset value of the analog signal processing and amplifying unit in association with the scanning speed and also adjusts the contrast of the image by adjusting the gain of the detector in accordance with the scanning speed.

13. The measurement and inspection device according to claim 2, wherein the preamplifier and the analog signal processing and amplifying unit are connected to each other through a first cable through which a differential signal is transmitted;

the preamplifier is provided with an amplifier for outputting the differential signal; and the analog signal processing and amplifying unit comprises a first clamp amplifier of a single output type to which the differential signal is inputted and from which the signal is outputted at a maximum output level limit value which is set in accordance with the gain of the detector.

14. The measurement and inspection device according to claim 2, wherein the analog signal processing and amplifying unit and the AD conversion unit are connected to each other through a second cable through which a differential signal is transmitted; and the analog signal processing and amplifying unit comprises a second clamp amplifier of a single input type which outputs the differential signal at a maximum output level limit value which is set in accordance with the input range of the AD conversion unit, with the AD conversion unit being provided with an AD converter to which the differential signal is inputted.

15. The measurement and inspection device according to claim 2, further comprising:

an emission unit for emitting the electron beam and an optical lens for directing the electron beam, both of which serve as the electron optical system;

a deflector for controlling a deflection of the electron beam upon scan control of the electron beam, and a deflection control unit for controlling the deflector;

a mechanical system for shift-controlling the sample; and a mechanical system control unit for controlling the mechanical system.

* * * * *